United States Patent
Oh et al.

(10) Patent No.: US 12,250,844 B2
(45) Date of Patent: Mar. 11, 2025

(54) DISPLAY DEVICE

(71) Applicant: Samsung Display Co., Ltd., Yongin-Si (KR)

(72) Inventors: Keun Chan Oh, Hwaseong-Si (KR); Sun Kyu Joo, Suwon-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 616 days.

(21) Appl. No.: 17/419,896

(22) PCT Filed: Feb. 19, 2019

(86) PCT No.: PCT/KR2019/001944
§ 371 (c)(1),
(2) Date: Jun. 30, 2021

(87) PCT Pub. No.: WO2020/141650
PCT Pub. Date: Jul. 9, 2020

(65) Prior Publication Data
US 2022/0085334 A1    Mar. 17, 2022

(30) Foreign Application Priority Data
Dec. 31, 2018  (KR) .......................... 10-2018-0174159

(51) Int. Cl.
*H01L 51/52*    (2006.01)
*H01L 27/32*    (2006.01)
(Continued)

(52) U.S. Cl.
CPC ......... *H10K 50/858* (2023.02); *H10K 50/865* (2023.02); *H10K 59/12* (2023.02); *H10K 59/38* (2023.02)

(58) Field of Classification Search
CPC .... H10K 50/858; H10K 50/19; H10K 59/879; H10K 59/12; H10K 59/38; H10K 59/35; H10K 59/32
See application file for complete search history.

(56) References Cited

U.S. PATENT DOCUMENTS 8,921,840 B2    12/2014   Kim et al.
9,142,802 B2     9/2015   Miyamoto et al.
(Continued)

FOREIGN PATENT DOCUMENTS

CN    103811521 A    5/2014
CN    104409657 A    3/2015
(Continued)

OTHER PUBLICATIONS

Chinese Office Action corresponding to Application No. 201980087430.2, dated on Jan. 10, 2024, 6 pages.

*Primary Examiner* — Victor A Mandala
*Assistant Examiner* — Lawrence C Tynes, Jr.
(74) *Attorney, Agent, or Firm* — Innovation Counsel LLP

(57) ABSTRACT

A display device is provided. The display device comprises: a first substrate including a plurality of pixels; a second substrate opposite to the first substrate; and an optical path change layer disposed between the first and second substrates and including a first pattern portion and a second pattern portion, wherein the first pattern portion has a first refractive index and includes a blue colorant, and the second pattern portion has a second refractive index smaller than the first refractive index.

18 Claims, 28 Drawing Sheets

(51) Int. Cl.
_H10K 50/858_ (2023.01)
_H10K 50/86_ (2023.01)
_H10K 59/12_ (2023.01)
_H10K 59/38_ (2023.01)

(56) References Cited

U.S. PATENT DOCUMENTS

| | | | |
|---|---|---|---|
| 10,224,377 B2 | 3/2019 | Park et al. | |
| 10,686,159 B2 | 6/2020 | Ma et al. | |
| 10,962,821 B2 | 3/2021 | Jung et al. | |
| 2009/0269485 A1* | 10/2009 | Ikeda | C23C 14/048 427/66 |
| 2014/0124749 A1 | 5/2014 | Kim et al. | |
| 2015/0084026 A1 | 3/2015 | Miyamoto et al. | |
| 2015/0333108 A1 | 11/2015 | Myamoto et al. | |
| 2016/0003450 A1* | 1/2016 | Lee | F21V 13/04 362/268 |
| 2018/0012940 A1 | 1/2018 | Park et al. | |
| 2018/0203291 A1* | 7/2018 | Jung | G02F 1/133516 |
| 2018/0210282 A1 | 7/2018 | Song et al. | |
| 2018/0233688 A1 | 8/2018 | Chen et al. | |
| 2019/0165053 A1 | 5/2019 | Park et al. | |

FOREIGN PATENT DOCUMENTS

| | | |
|---|---|---|
| CN | 108333814 A | 7/2018 |
| CN | 108345140 A | 7/2018 |
| JP | 2004227811 A | 8/2004 |
| JP | 2013182775 A | 9/2013 |
| JP | 2015069700 A | 4/2015 |
| JP | 2015128027 A | 7/2015 |
| KR | 10-2014-0059372 A | 5/2014 |
| KR | 10-2015-0003966 A | 1/2015 |
| KR | 10-2015-0083801 A | 7/2015 |
| KR | 10-2017-0001634 A | 1/2017 |
| KR | 10-2018-0005323 A | 1/2018 |
| KR | 10-2018-0018969 A | 2/2018 |
| KR | 10-2018-0074644 A | 7/2018 |

* cited by examiner

[Fig. 1]
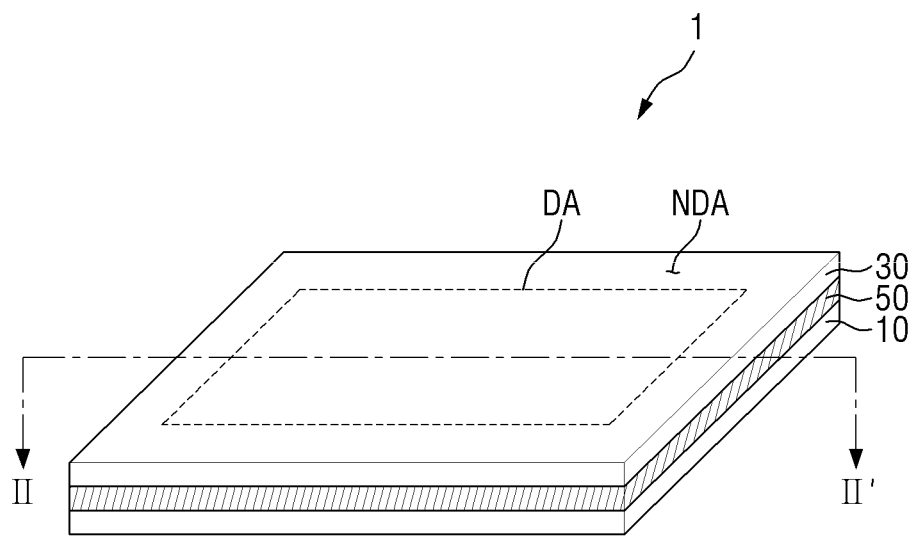

[Fig. 2]
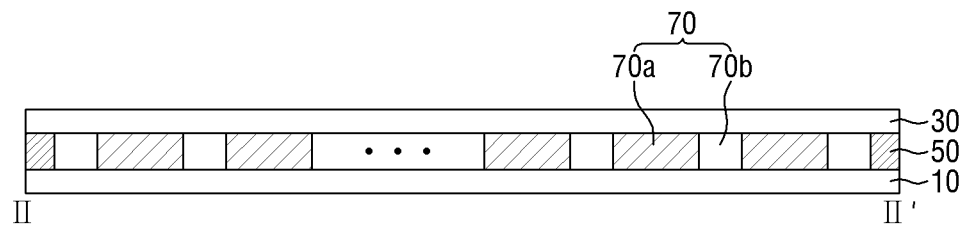

[Fig. 3]
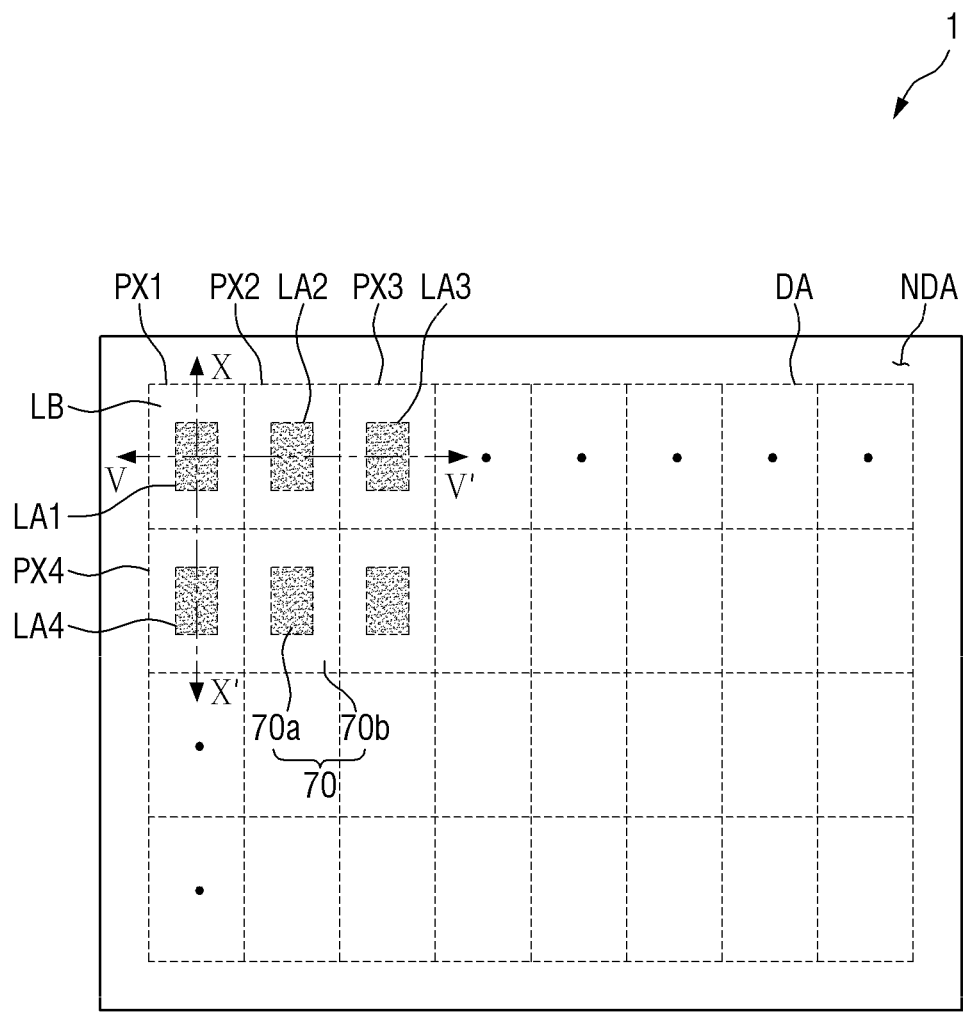

[Fig. 4]
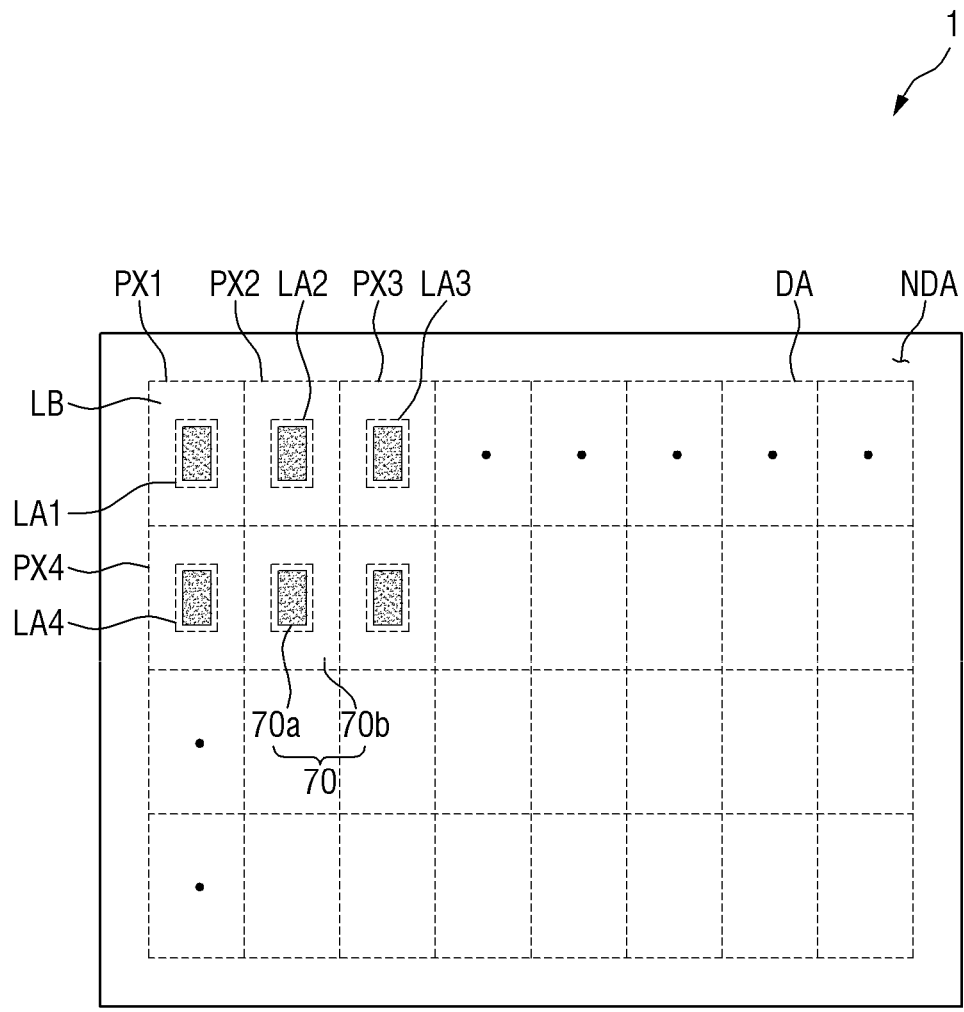

[Fig. 5]
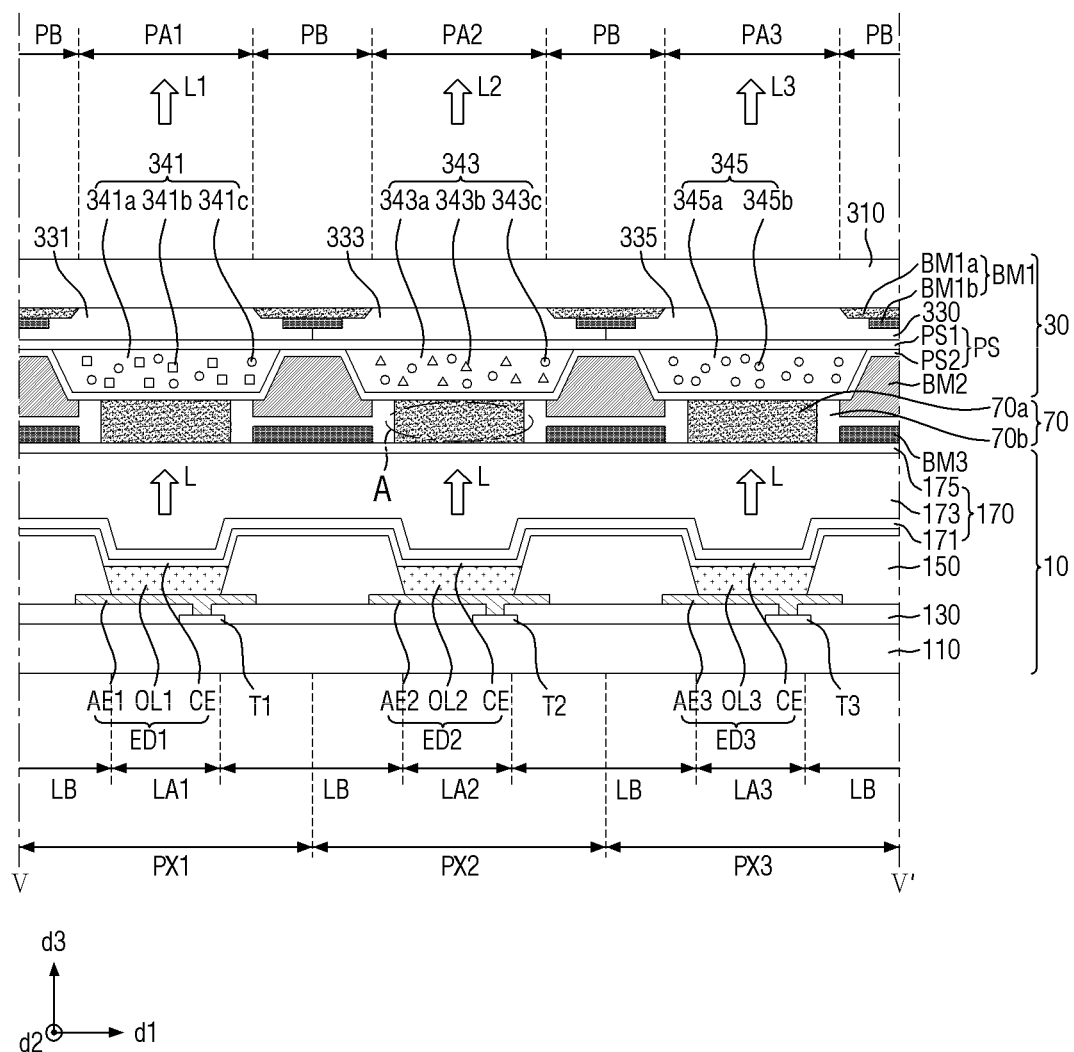

[Fig. 6]
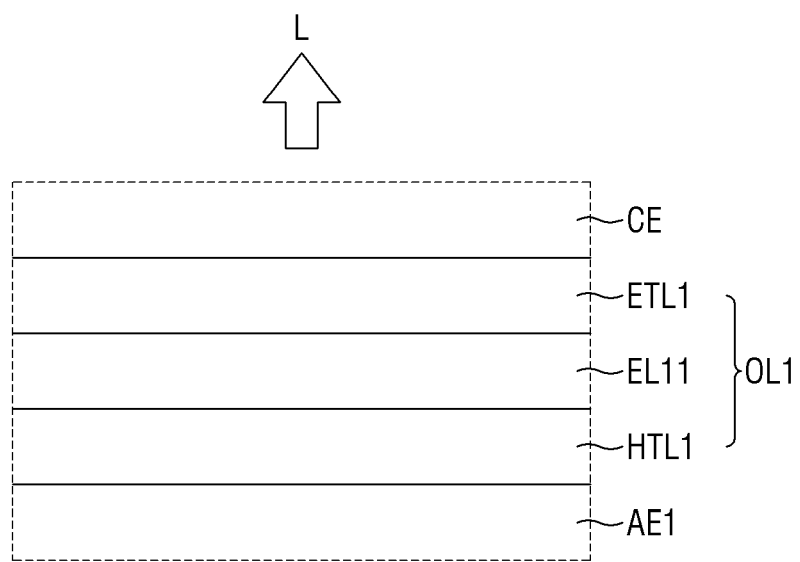

[Fig. 7]
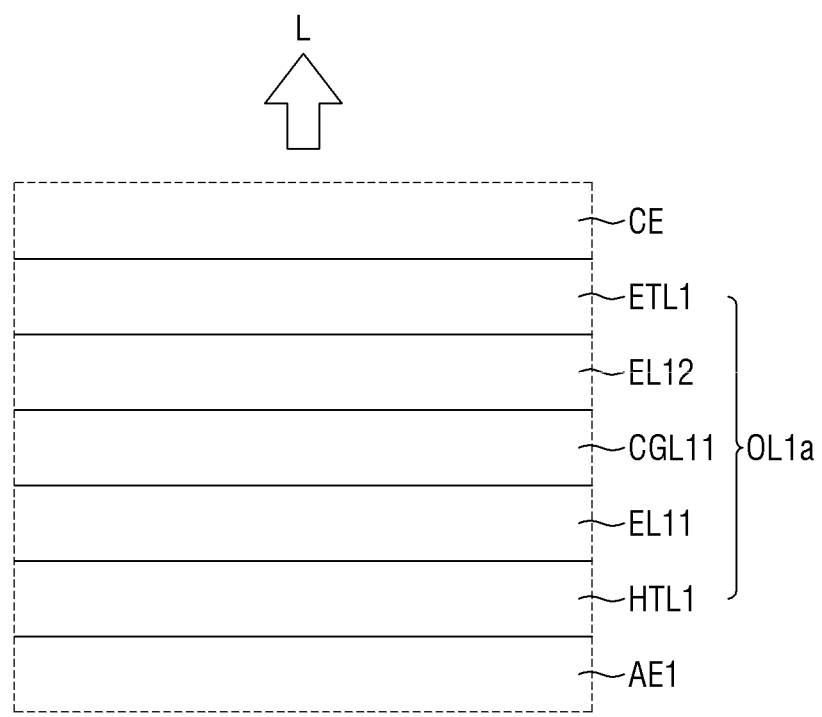

[Fig. 8]
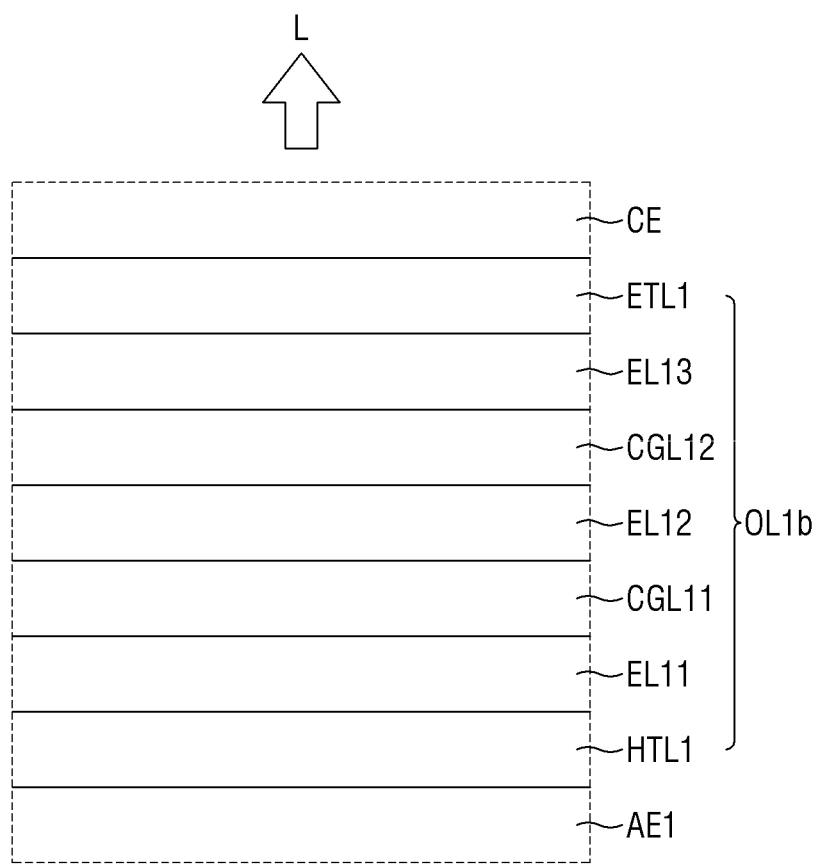

[Fig. 9]
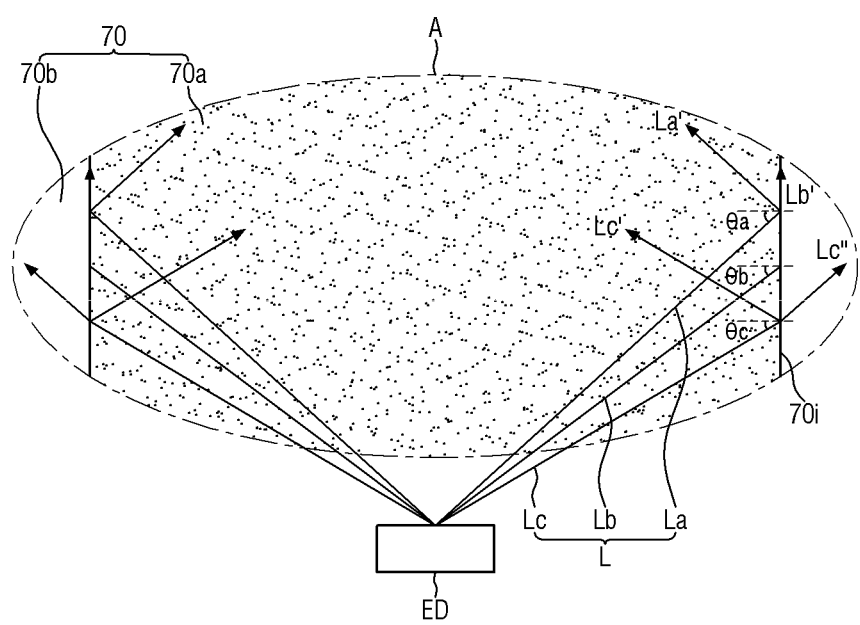

[Fig. 10]
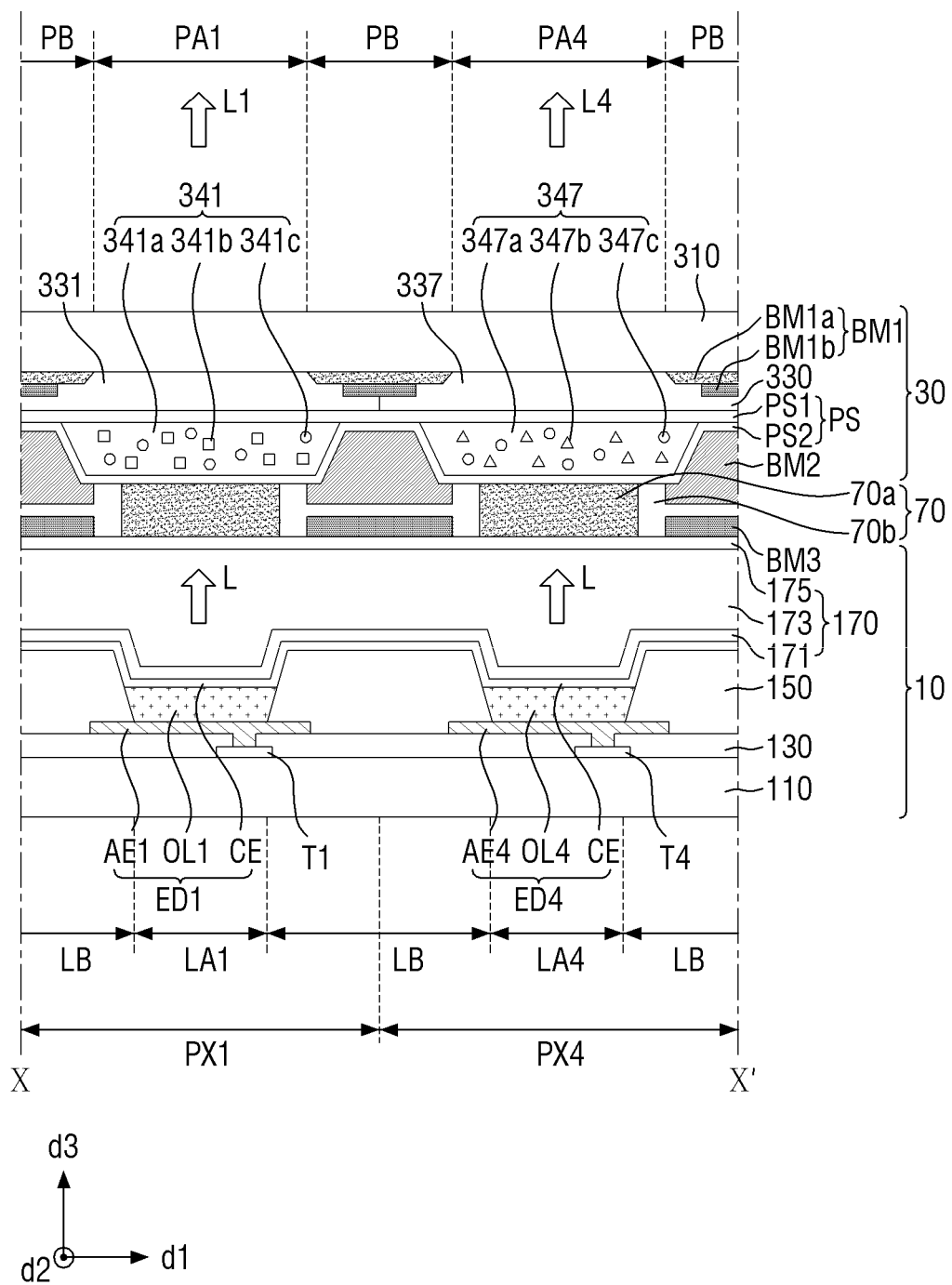

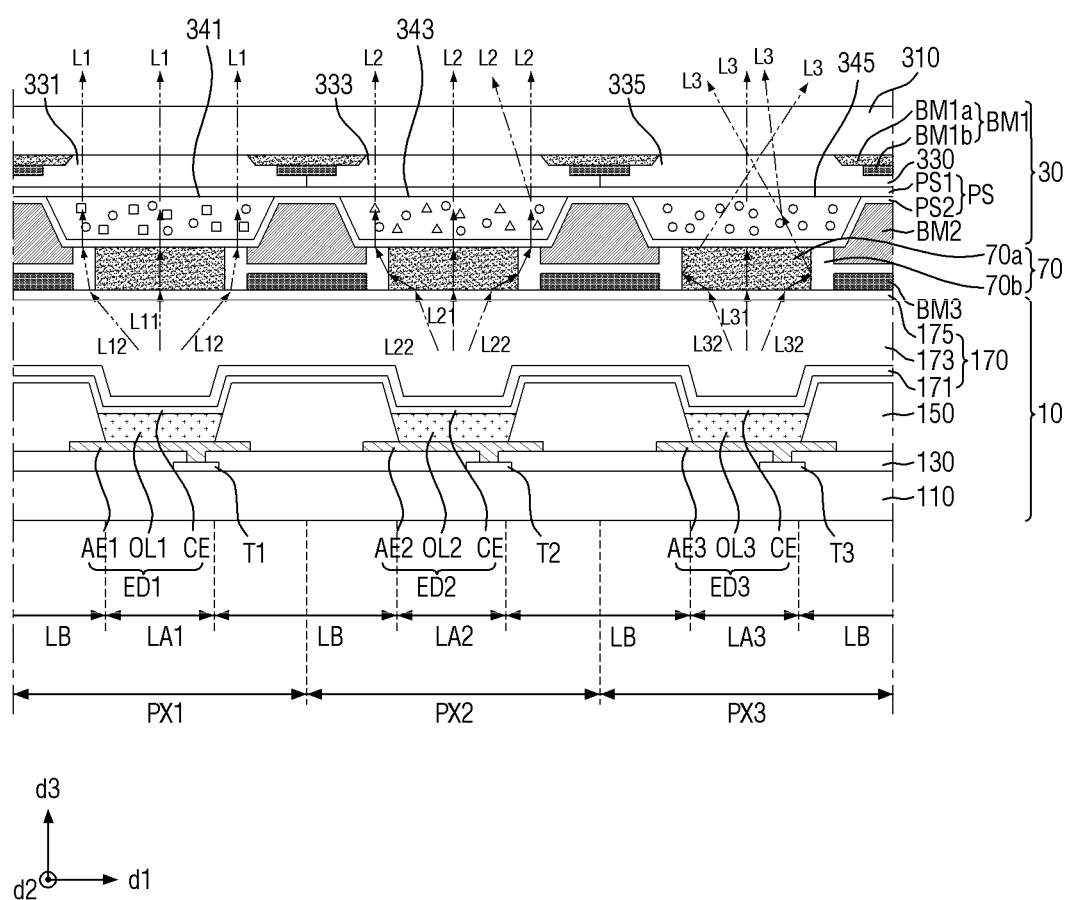
[Fig. 11]

[Fig. 12]
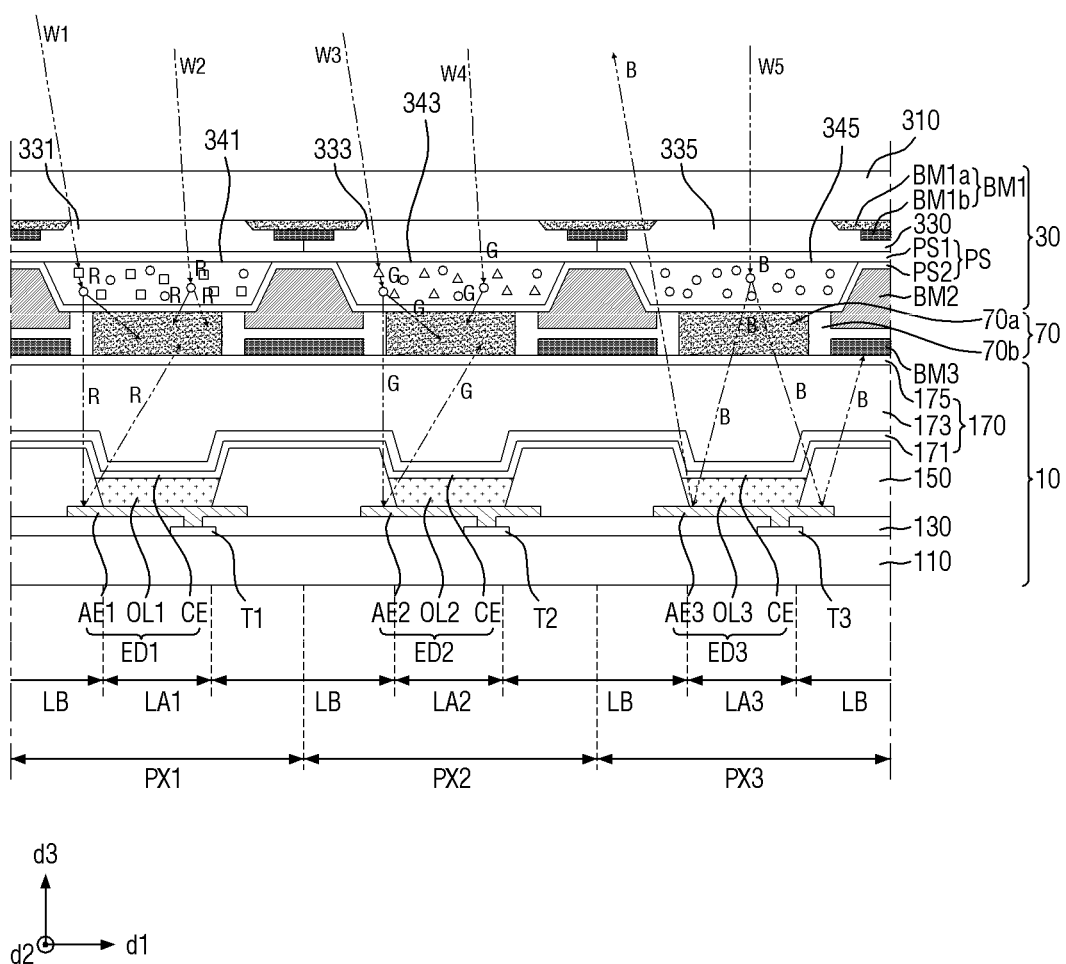

[Fig. 13]
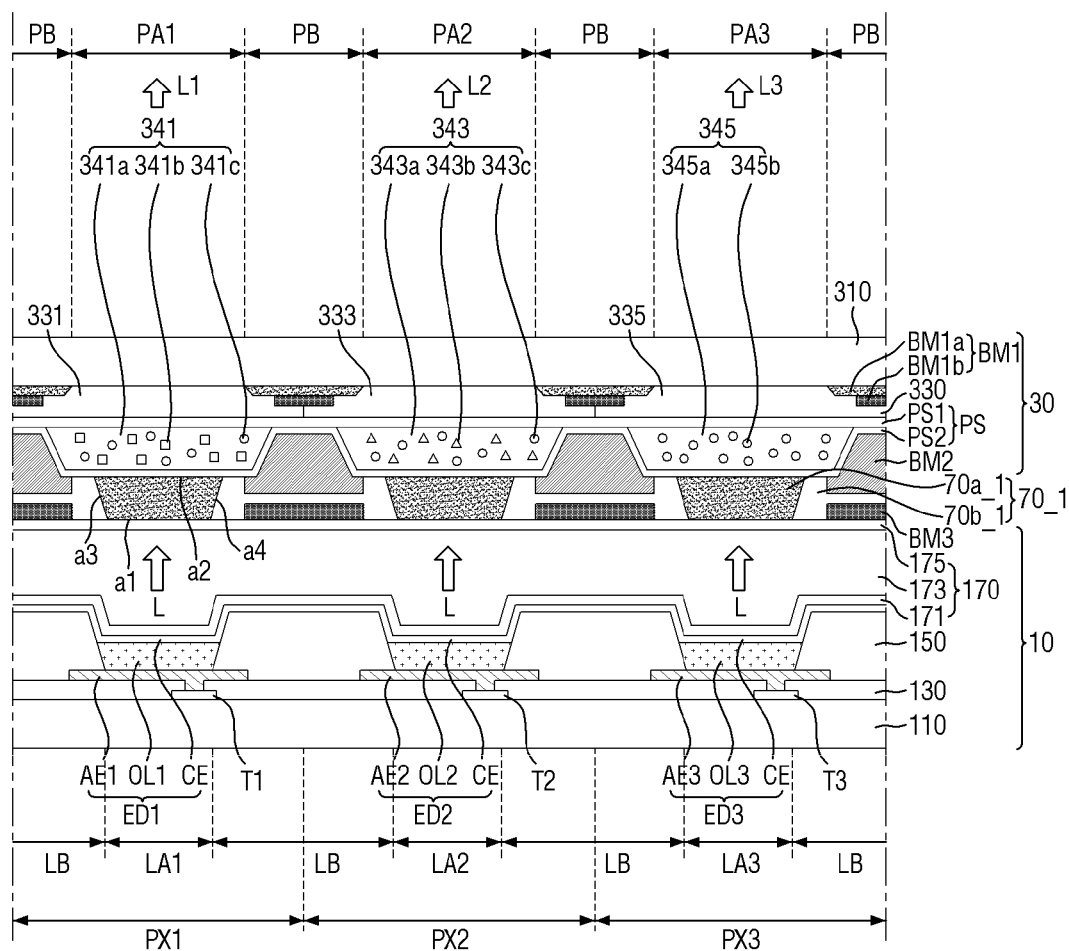

[Fig. 14]
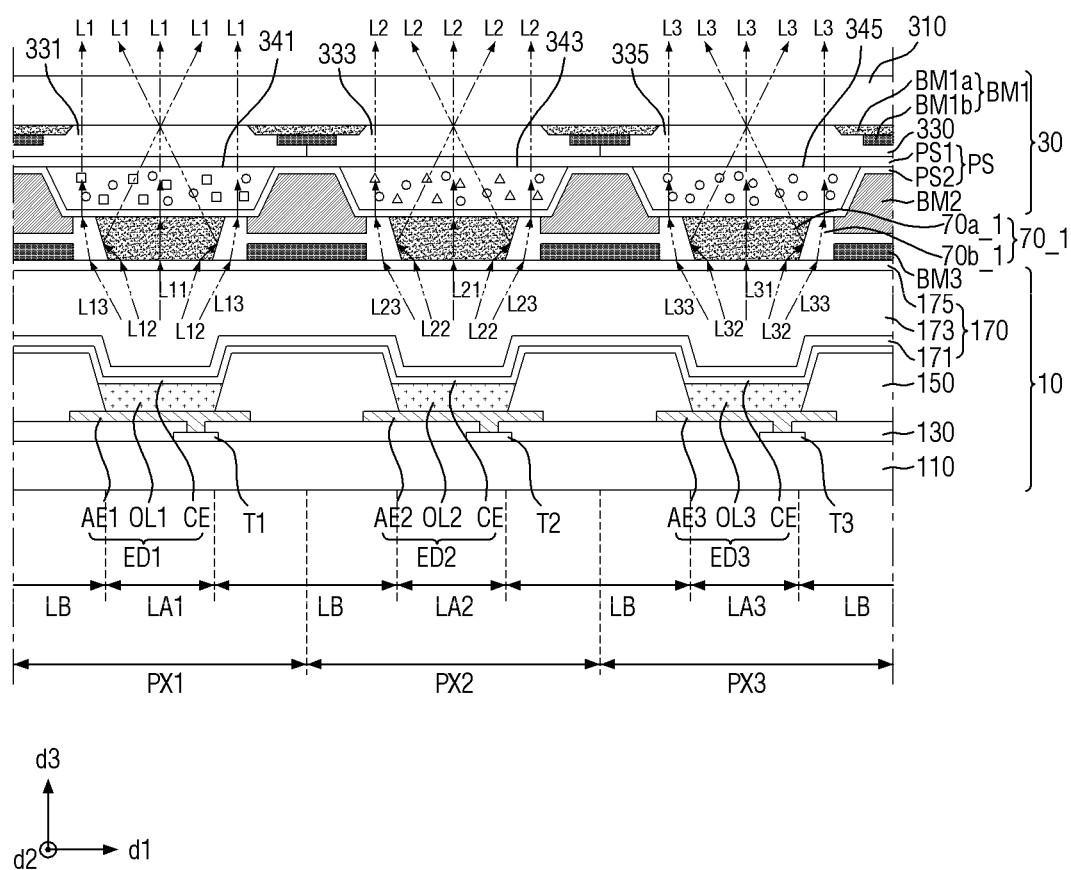

[Fig. 15]
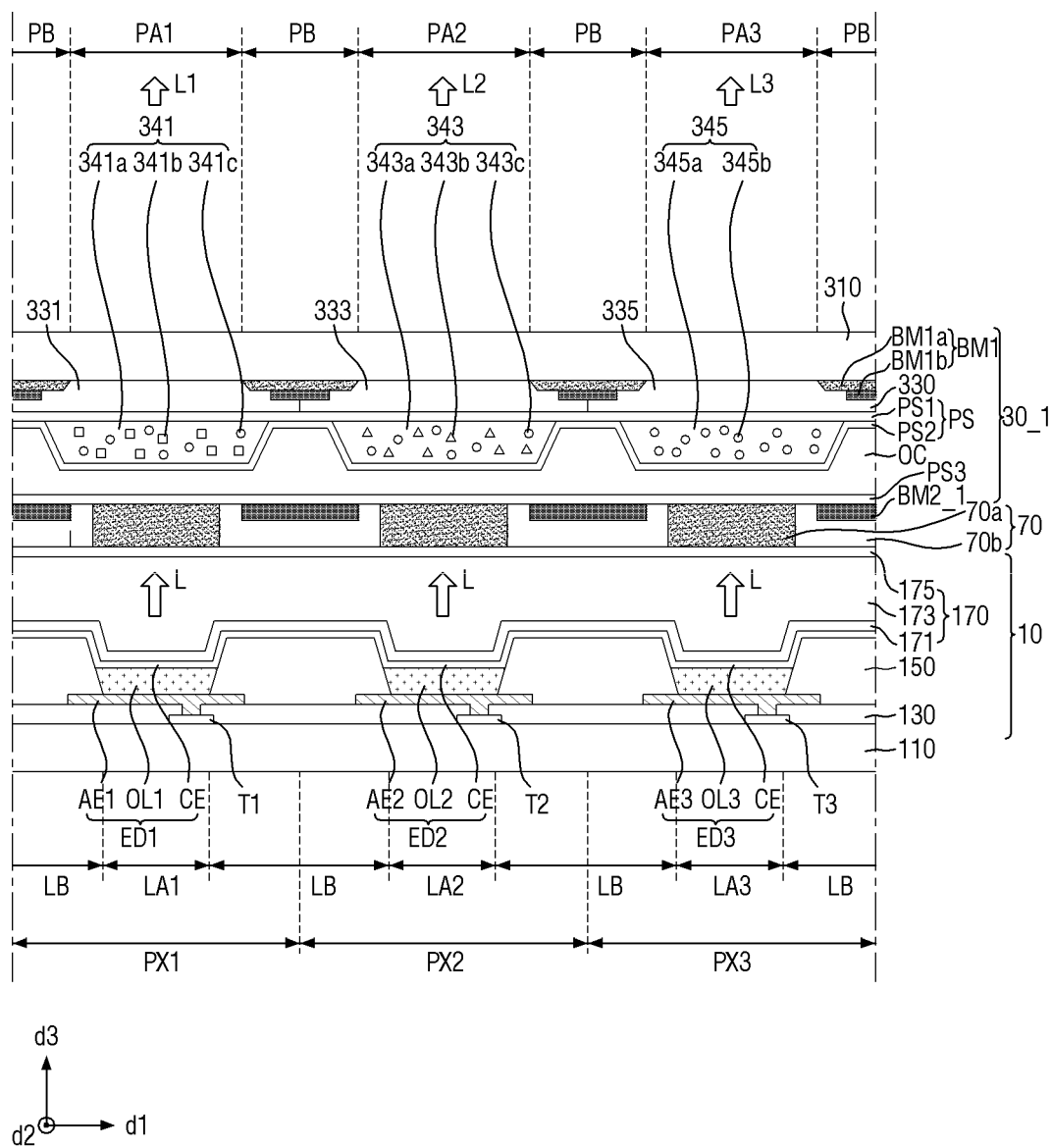

[Fig. 16]
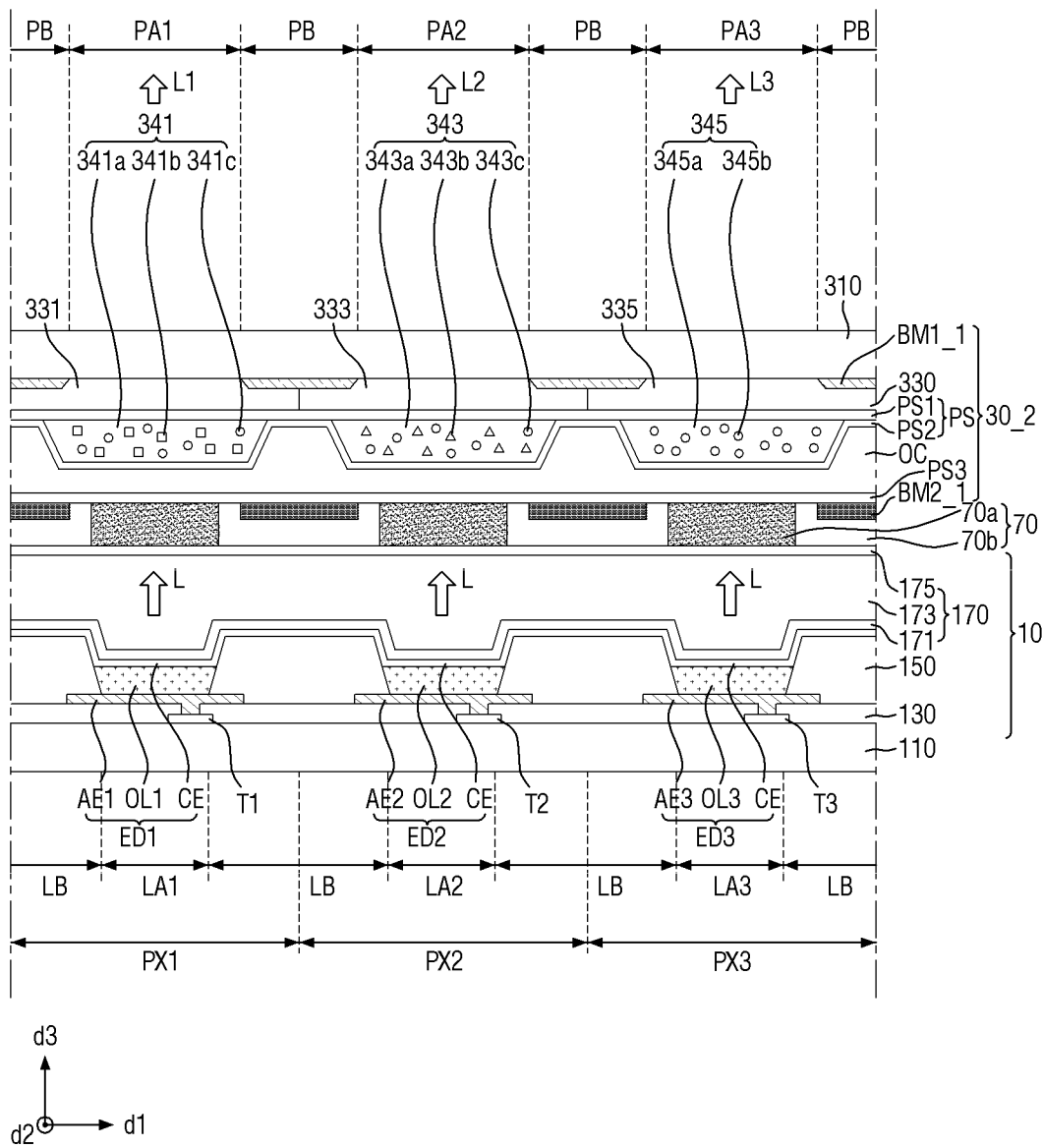

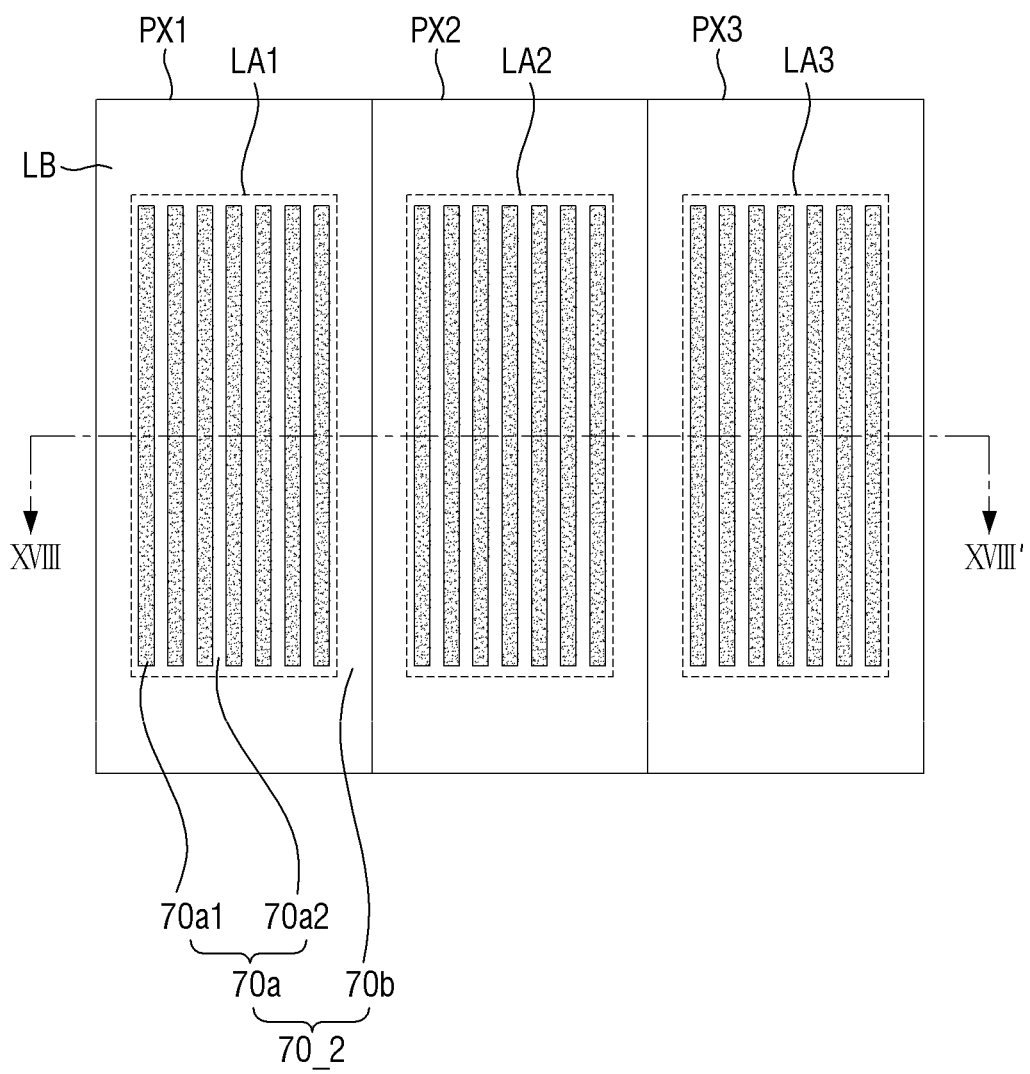
【Fig. 17】

【Fig. 18】
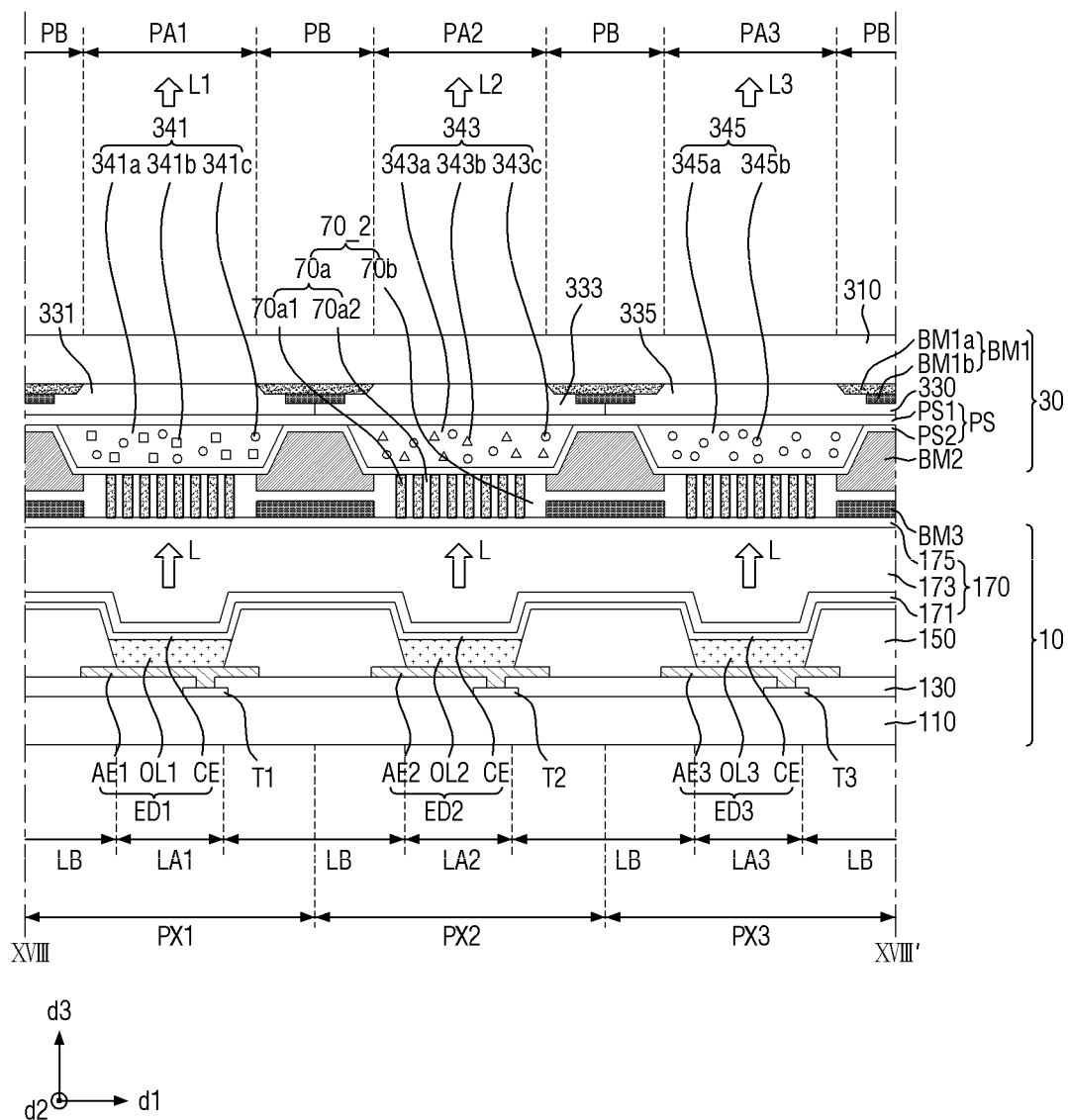

[Fig. 19]
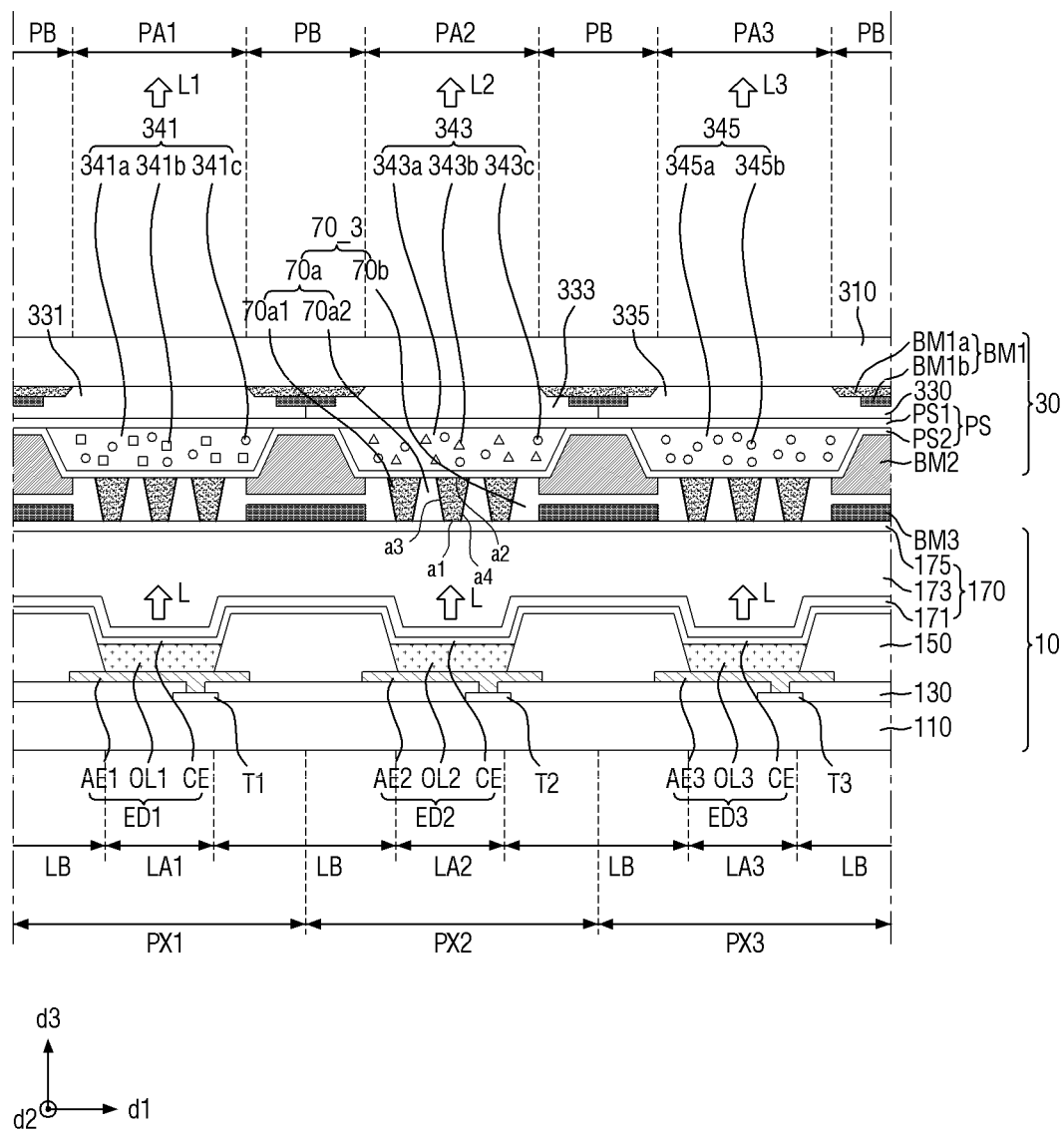

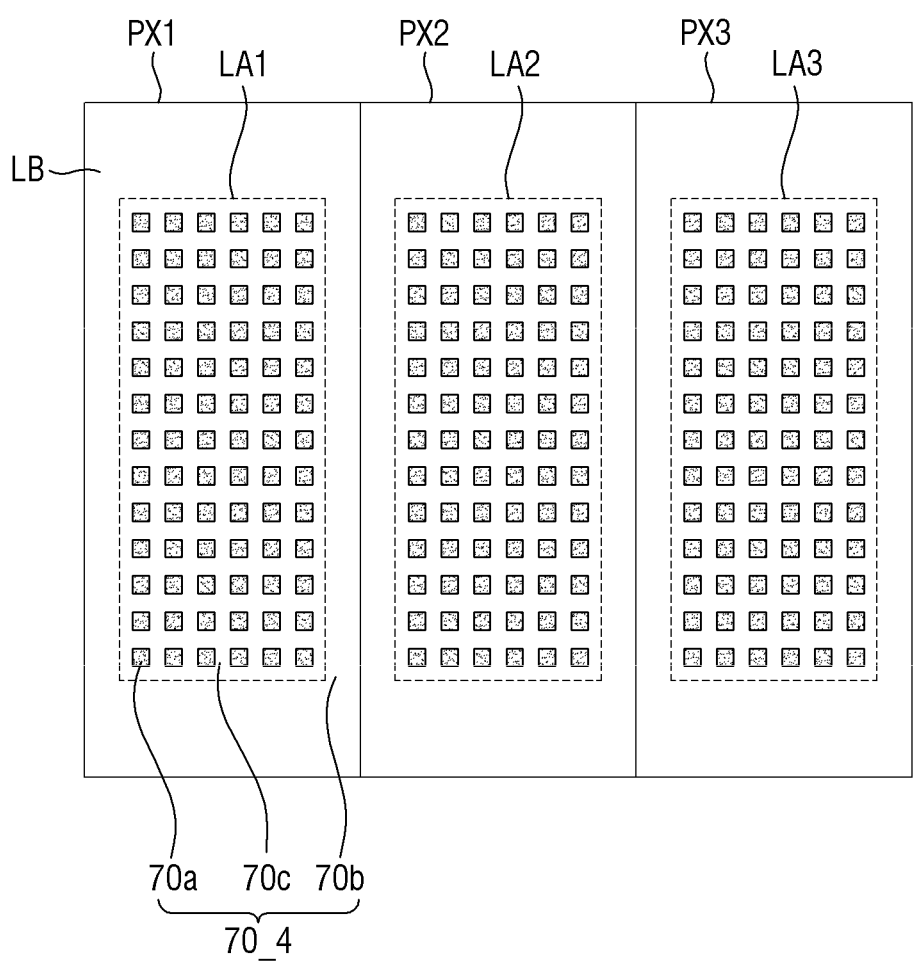
[Fig. 20]

[Fig. 21]
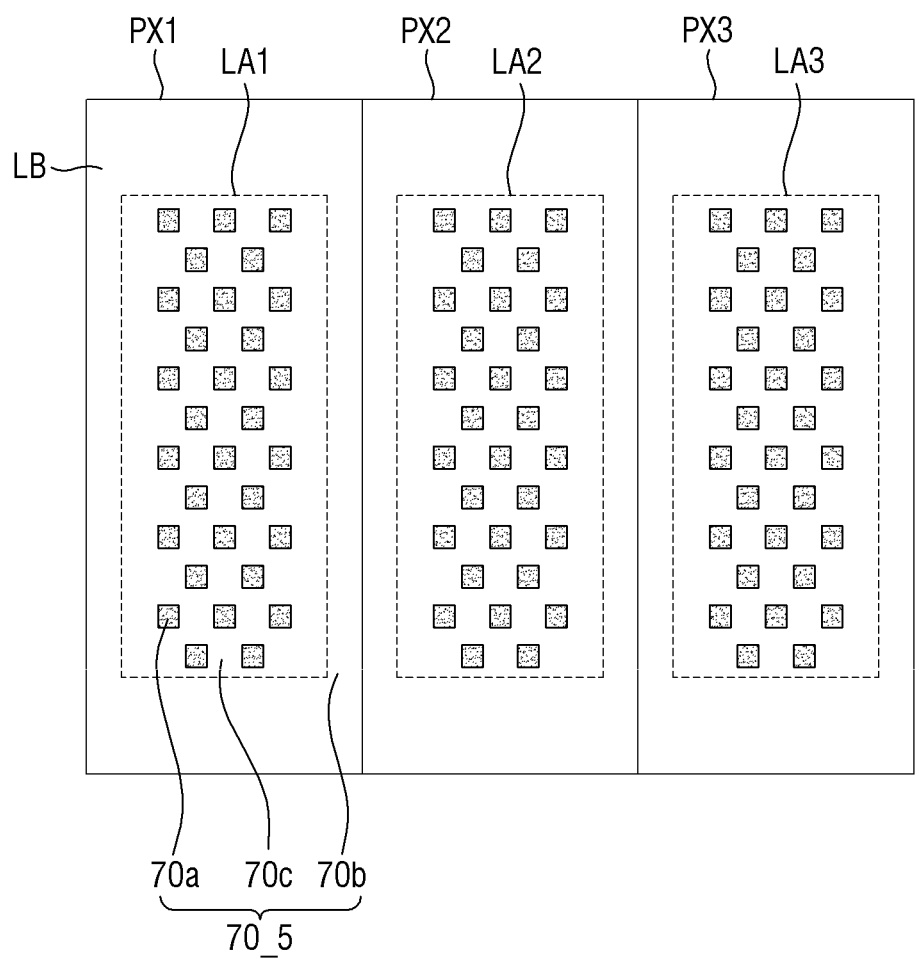

[Fig. 22]
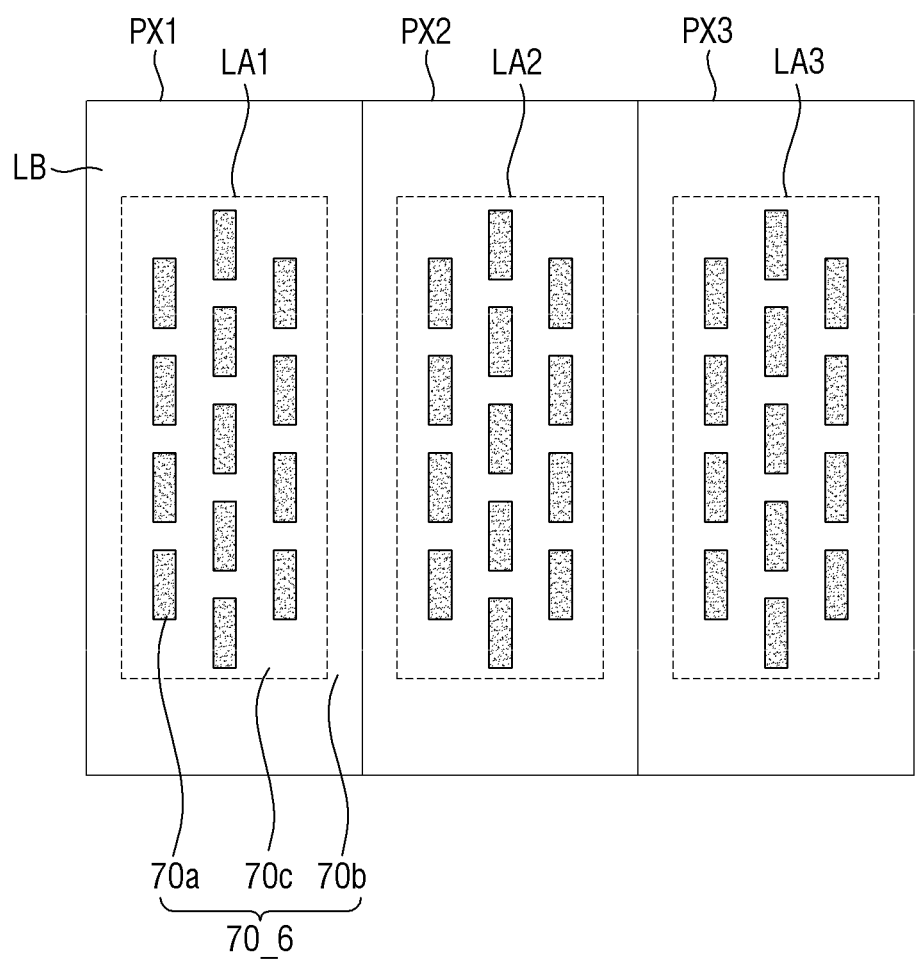

【Fig. 23】
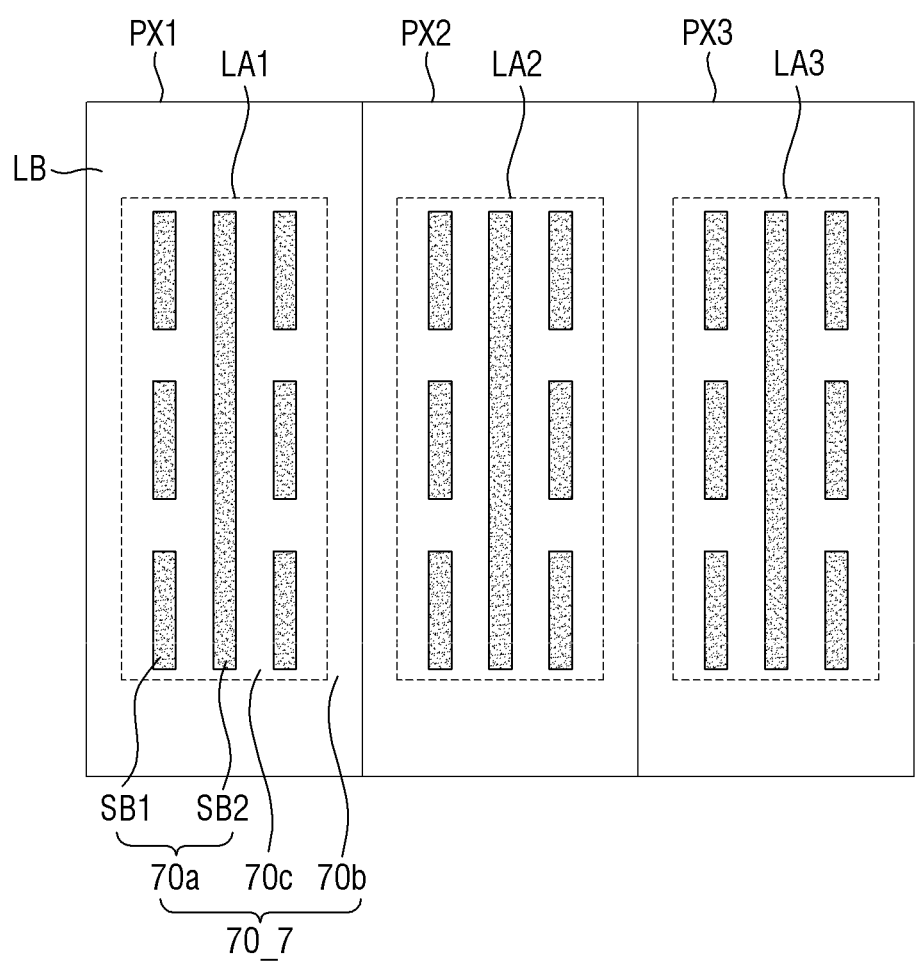

[Fig. 24]
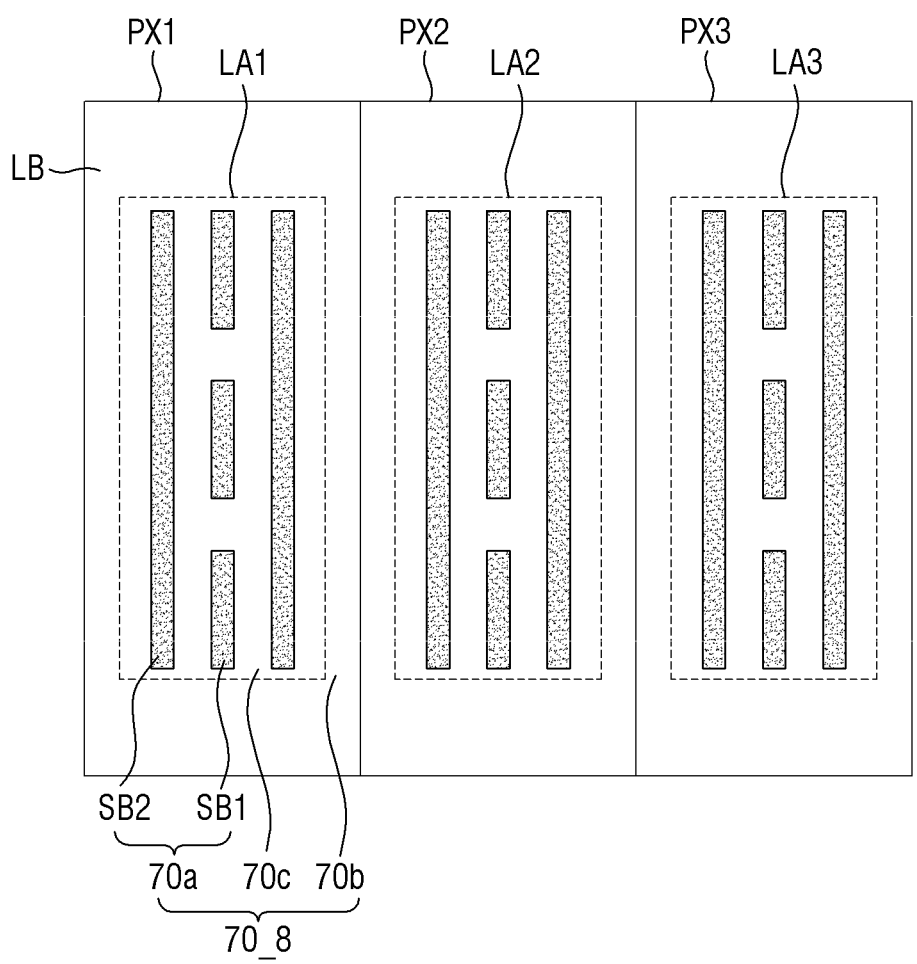

[Fig. 25]
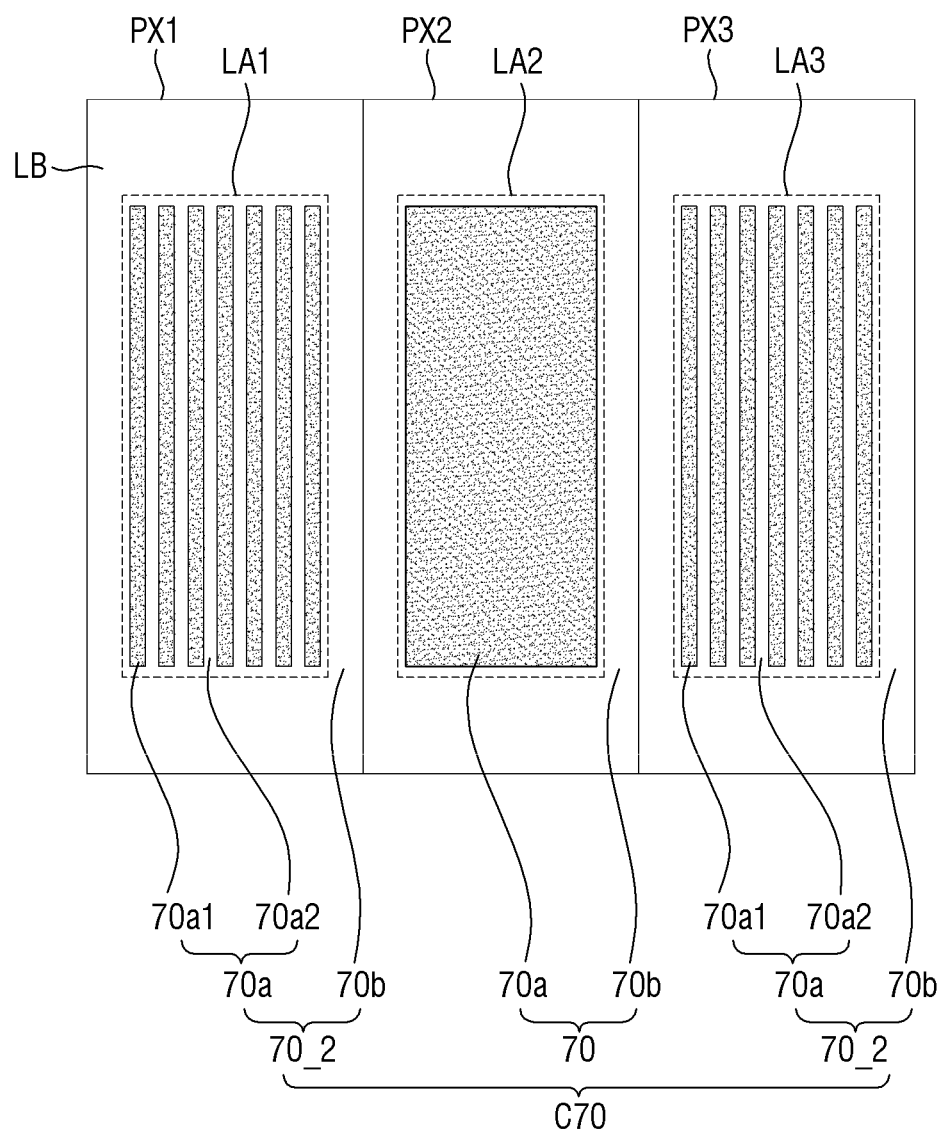

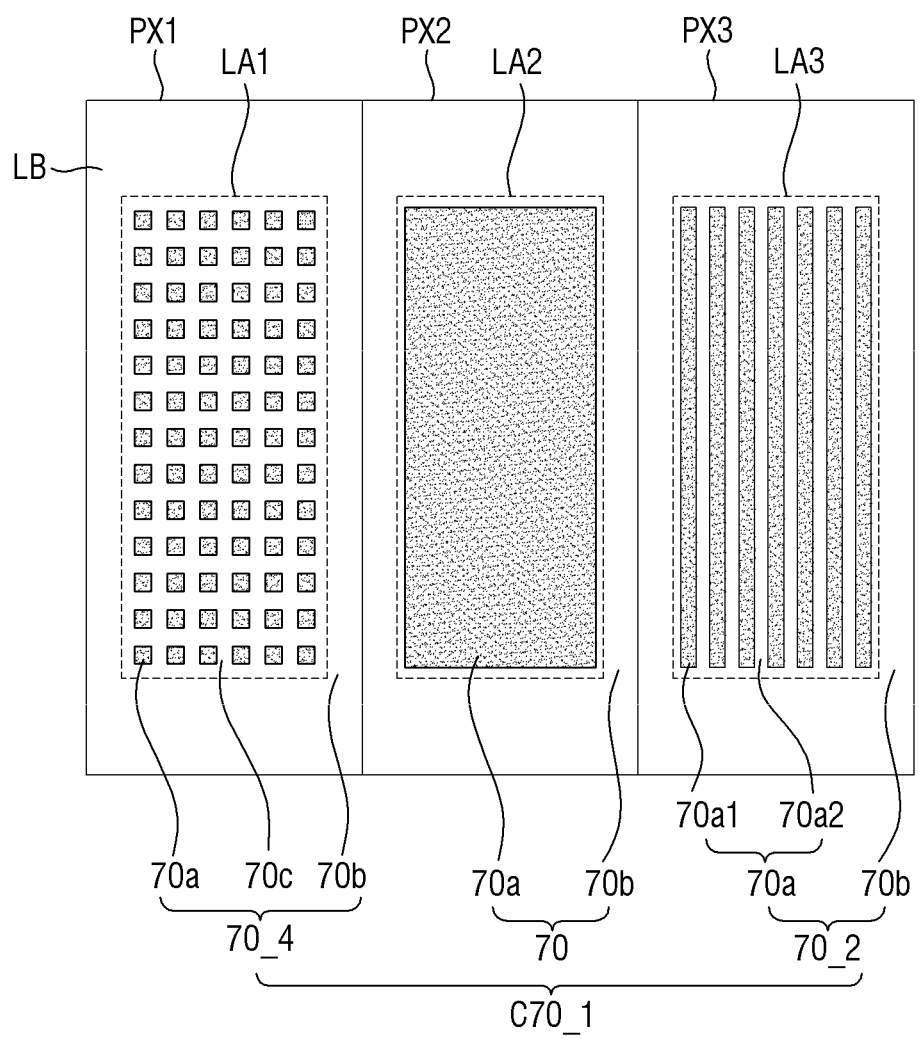
[Fig. 26]

[Fig. 27]
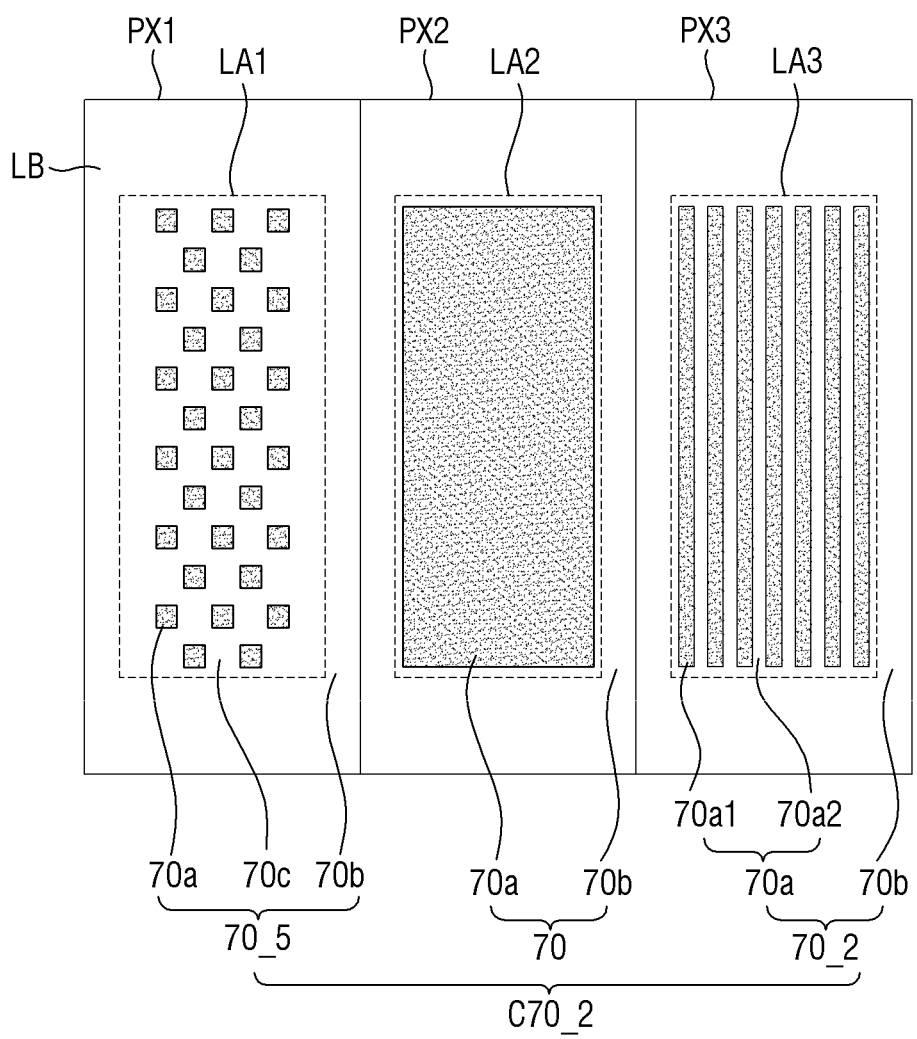

【Fig. 28】
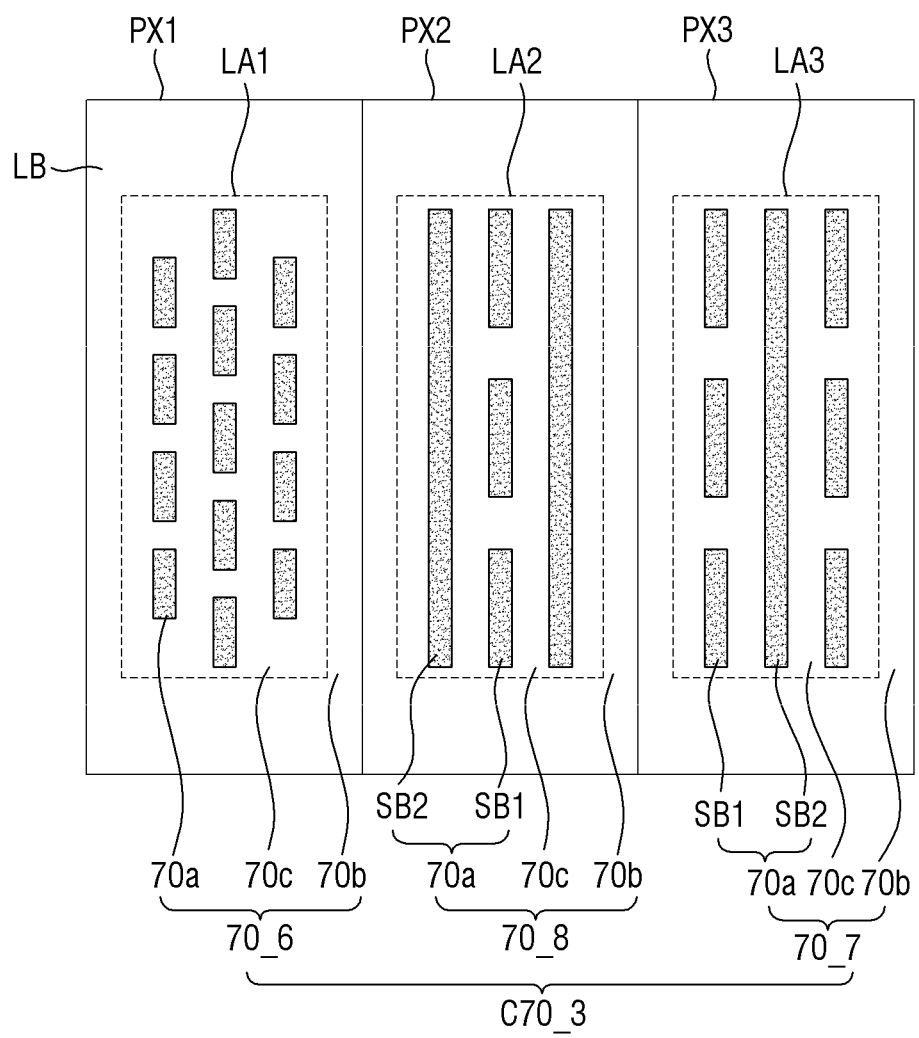

DISPLAY DEVICE

CROSS-REFERENCE TO RELATED APPLICATION

This application claims priority to Korean Patent Application No. 10-2018-0174159 filed on Dec. 31, 2018, and PCT Application No PCT/KR2019/001944, filed on Feb. 19, 2019, the entire contents of which are incorporated herein by reference.

BACKGROUND

1. Field of the Disclosure

The present inventive concept relates to a display device.

2. Description of the Related Art

A display device is becoming increasingly important with the development of multimedia. In response to this, various kinds of display devices such as a liquid crystal display (LCD) device, an organic light-emitting diode display (OLED) device, and the like have been developed.

Among the display devices, the organic OLED device includes an organic light-emitting element which is a self-emission element. The organic light-emitting element may include two opposing electrodes and an organic emission layer interposed therebetween. Electrons and holes provided from the two electrodes recombine in the emission layer to generate excitons, and the generated excitons transit from an excited state to a ground state, and light may be emitted.

Since such an OLED device does not require a separate light source, it may be configured to have low power consumption, a lightweight and thin structure, and may have high-quality characteristics such as a wide viewing angle, high brightness and contrast, and a quick response time, and accordingly, the OLED device is attracting attention as a next-generation display device.

SUMMARY

An aspect of the present inventive concept is directed to providing a display device with improved color reproducibility (gamut) by reducing external light reflectance while preventing color mixing between pixels.

The aspects of the present inventive concept are not limited to the above-mentioned technical problems, and other technical problems not mentioned will be clearly understood by those skilled in the art from the following description.

One aspect of the present inventive concept provides a display device including a first substrate including a plurality of pixels, a second substrate facing the first substrate, and an optical path change layer disposed between the first and second substrates and including a first pattern portion and a second pattern portion, wherein the first pattern portion has a first refractive index and includes a blue colorant, and, the second pattern portion has a second refractive index smaller than the first refractive index.

The first pattern portion may absorb green wavelength light and red wavelength light and may transmit blue wavelength light.

The first pattern portion may be disposed on each of the plurality of pixels and the second pattern portion may be disposed at each boundary of the plurality of pixels and may be in contact with the first pattern portion.

The first pattern portion may include a first surface in contact with the first substrate and a second surface in contact with the second substrate, and an area of the second surface may be larger than an area of the first surface.

The first pattern portion may include at least one of acryl, a cardo-based resin, and fluorine-containing polyurethane acrylate (F-PUA).

The second pattern portion may be an air gap.

The refractive index of the first pattern portion may be 1.4 or more.

A thickness of the optical path change layer may be less than or equal to 5 um.

The first substrate may further include an organic light-emitting element disposed on each of the plurality of pixels and the organic light-emitting element may output blue light.

The first substrate may include an encapsulation layer covering the organic light-emitting element, the second substrate may include a wavelength conversion pattern and a light transmission pattern, and a capping layer covering the wavelength conversion pattern and the light transmission pattern, and the optical path change layer may be disposed between the capping layer and the encapsulation layer.

Another aspect of the present inventive concept provides a display device including a first base part including a plurality of pixel regions in which a plurality of pixels are disposed, an organic light-emitting element disposed on the first base part and disposed on each of the plurality of pixels, an encapsulation layer disposed on the organic light-emitting element, a second base part facing the first base part, the second base part including a wavelength conversion pattern and a light transmission pattern disposed between the second base part and the encapsulation layer, and a capping layer covering the wavelength conversion pattern and the light transmission pattern, and an optical path change layer contacting each of the encapsulation layer and the capping layer, wherein the optical path change layer includes a first pattern portion having a first refractive index and a second pattern portion having a second refractive index smaller than the first refractive index, and the first pattern portion includes a blue colorant.

The first pattern portion may absorb green wavelength light and red wavelength light and may transmit blue wavelength light.

Each of the plurality of pixels may include an emission region and a non-emission region, the first pattern portion may be disposed to correspond to the emission region, and the second pattern portion may be disposed to correspond to the non-emission region.

The first pattern portion may include a plurality of high refractive portions and a plurality of low refractive portions respectively disposed between the plurality of high refractive portions.

The display device may further include a first light-blocking layer disposed between the second base part, and the wavelength conversion pattern and the light transmission pattern, and disposed to correspond to a boundary of each of the plurality of pixels, wherein the first light-blocking layer may include a first light-blocking portion disposed on the second base part and a second light-blocking portion disposed on the first light-blocking portion, and the first light-blocking portion may include a blue colorant.

The display device may further include a second light-blocking layer disposed between the wavelength conversion pattern and the light transmission pattern, wherein the second light-blocking layer may overlap the first light-blocking layer in a thickness direction.

The display device may further include a third light-blocking layer disposed on the encapsulation layer, wherein the third light-blocking layer may overlap the second light-blocking layer in the thickness direction.

Still another aspect of the present inventive concept provides a display device including a first substrate in which a display region including a plurality of pixels each including an emission region and a non-emission region and a non-display region surrounding the display region are defined, a second substrate facing the first substrate, and an optical path change layer disposed between the first substrate and the second substrate, wherein the optical path change layer includes a high refractive pattern portion having a refractive index of 1.4 or more and an air gap surrounding the high refractive pattern portion, and the high refractive pattern portion includes a blue colorant, absorbs green wavelength light and red wavelength light, and transmits blue wavelength light.

The high refractive pattern portion may be disposed on the emission region and the air gap may be disposed on the non-emission region and the non-display region.

The high refractive pattern portion may be disposed to correspond to the emission region and a part of the non-emission region, and the air gap may be disposed to correspond to a part of the non-emission region and a part of the non-display region.

A plurality of high refractive pattern portions may be disposed in an island shape on the emission region and the air gap may be disposed to surround each of the plurality of high refractive pattern portions.

The high refractive pattern portions may have a plurality of bar shapes and may be disposed to be spaced apart on the emission region, and the air gap may be disposed to surround each of the plurality of high refractive pattern portions.

The emission region may include first to third emission regions and at least one of the optical path change layer disposed in the first to third emission regions has different shape than other optical path change layers.

Specific details of other embodiments are included in the specific description and the drawings.

A display device according to an embodiment can improve color reproducibility (gamut) by preventing color mixing between adjacent pixels.

The display device according to an embodiment can improve image quality by reducing the reflectance of external light.

Effects according to the present inventive concept are not limited by the contents illustrated above, and more various effects are included in the present specification.

BRIEF DESCRIPTION OF THE DRAWINGS

FIG. 1 is a perspective view of a display device according to an embodiment.

FIG. 2 is a schematic cross-sectional view of the display device taken along line II-II' in FIG. 1.

FIG. 3 is a schematic plan view of the display device according to an embodiment.

FIG. 4 is a schematic plan view of a display device according to another embodiment.

FIG. 5 is a cross-sectional view of the display device according to an embodiment taken along line V-V' in FIG. 3.

FIG. 6 is an enlarged cross-sectional view of an organic layer of FIG. 5.

FIG. 7 is a cross-sectional view showing a modified example of a structure shown in FIG. 6.

FIG. 8 is a cross-sectional view showing another modification of the structure shown in FIG. 6.

FIG. 9 is a partially enlarged view for describing an optical path in region A in FIG. 5.

FIG. 10 is a cross-sectional view of the display device according to an embodiment taken along line X-X' of FIG. 3.

FIG. 11 is a view for describing a path of emitted light of an organic light-emitting element in an embodiment.

FIG. 12 is a view for describing a path of external light in an embodiment.

FIG. 13 is a cross-sectional view of a display device according to another embodiment.

FIG. 14 is a view for describing a path of emitted light of an organic light-emitting element in another embodiment.

FIG. 15 is a cross-sectional view of a display device according to another embodiment.

FIG. 16 is a cross-sectional view of a display device according to another embodiment.

FIG. 17 is a schematic plan view of a display device according to another embodiment.

FIG. 18 is a cross-sectional view taken along line XVIII-XVIII' in FIG. 17.

FIG. 19 is a schematic cross-sectional view of a display device according to another embodiment.

FIGS. 20 and 21 are schematic plan views of display devices according to other embodiments.

FIG. 22 is a schematic plan view of a display device according to another embodiment.

FIGS. 23 and 24 are schematic plan views of display devices according to other embodiments.

FIGS. 25, 26, 27 and 28 are schematic plan views of display devices according to other embodiments.

DETAILED DESCRIPTION OF THE EMBODIMENTS

Advantages and features of the present inventive concept, and methods for achieving them will be apparent with reference to the embodiments described below in detail with reference to the accompanying drawings. However, the present inventive concept is not limited to the embodiments disclosed below but may be implemented in different forms, and only these embodiments are provided to complete the disclosure of the present inventive concept, and to fully inform the scope of the inventive concept to those of ordinary skill in the art to which the present inventive concept pertains, that is, the present inventive concept is defined only by the scope of the claims.

When an element or layer are referred to as "on" another element or layer, this includes not only directly on another element or layer but also having another layer or element interposed therebetween. The same reference numerals refer to the same elements throughout the specification. The shapes, sizes, ratios, angles, numbers, etc. disclosed in the drawings for describing the embodiments are examples, and thus the present inventive concept is not limited to the illustrated details. The same reference numerals refer to the same elements throughout the specification.

Hereinafter, specific embodiments will be described with reference to the accompanying drawings.

FIG. 1 is a perspective view of a display device according to an embodiment, FIG. 2 is a schematic cross-sectional view of the display device taken along line II-II' in FIG. 1, FIG. 3 is a schematic plan view of the display device according to an embodiment, and FIG. 4 is a schematic plan view of a display device according to another embodiment.

Referring to FIG. 1, a display device 1 may be used for a variety of electronic devices like small and medium-sized electronic equipment such as a tablet PC, a smart phone, a car navigation unit, a camera, a center information display (CID) provided to a car, a wrist watch type electronic device, and a personal digital assistant (PDA), a portable multimedia player (PMP), and a game console, and medium and large-sized electronic equipment such as a television, an external billboard, a monitor, a personal computer, and a notebook computer. These are merely presented as examples and, of course, the display device 1 may be adopted to other electronic devices without departing from the concept of the present inventive concept.

In some embodiments, the display device 1 may have a rectangular shape in a plan view. The display device 1 may include both short sides extending in one direction and both long sides extending in another direction crossing the one direction. A corner portion where the long side and the short side of the display device 1 meet may be a right angle in a plan view, but the present inventive concept is not limited thereto, and the corner portion may have a rounded curved shape. The planar shape of the display device 1 is not limited to the illustrated one and may have a square shape, a circular shape, an elliptical shape, or other shapes.

The display device 1 may include a display region DA displaying an image and a non-display region NDA that is disposed outside the display region DA and does not display an image. The display region DA may be disposed in a central portion of the display device 1, but the present inventive concept is not limited thereto, and the display region DA may be disposed in an edge region of the display device 1.

Referring to FIG. 2, the display device 1 according to an embodiment includes a first substrate 10, a second substrate 30 facing the first substrate 10, an optical path change layer 70 interposed between the first substrate 10 and the second substrate 30, and a sealing part 50 for mutually coupling the first substrate 10 and the second substrate 30 at edges of the first substrate 10 and the second substrate 30.

The first substrate 10 may include elements and circuits for displaying an image, for example, a pixel circuit such as a switching element, a pixel defining film defining an emission region and a non-emission region in the display region DA, and an organic light-emitting element. The first substrate 10 may be a display substrate.

The second substrate 30 is disposed above the first substrate 10 and faces the first substrate 10. The second substrate 30 may be a color conversion substrate including a color conversion pattern for converting a color of incident light, but the present inventive concept is not limited thereto.

In the non-display region NDA, the sealing part 50 may be disposed between the first substrate 10 and the second substrate 30. The sealing part 50 may be disposed along the edges of the first substrate 10 and the second substrate 30 in the non-display region NDA to surround the display region DA in a plan view. The first substrate 10 and the second substrate 30 may be coupled to each other through the sealing part 50. The sealing part 50 may be made of an organic material such as an epoxy-based resin, but the present inventive concept is not limited thereto.

The optical path change layer 70 may be disposed in a space between the first substrate 10 and the second substrate 30 surrounded by the sealing part 50.

The optical path change layer 70 may include a first pattern portion 70a and a second pattern portion 70b. The first pattern portions 70a and the second pattern portions 70b may be alternately disposed in a first direction d1 and a second direction d2. The first pattern portion 70a and the second pattern portion 70b may have different refractive indices. The second pattern portion 70b may be disposed to surround the first pattern portion 70a in a plan view, but the present inventive concept is not limited thereto.

For example, the first pattern portion 70a may be a high refractive pattern having a refractive index higher than that of the second pattern portion 70b, and the second pattern portion 70b may be a low refractive pattern having a refractive index lower than that of the first pattern portion 70b. Although the present inventive concept is not limited thereto, the first pattern portion 70a may be made of acryl, cardo-based resin, and fluorine-containing polyurethane acrylate (F-PUA). In addition, the first pattern portion 70a may include a blue colorant. The second pattern portion 70b may be an air gap or may include a gas including an inert gas such as nitrogen or argon, or a mixture of various types of gases. The optical path change layer 70 will be described in more detail later.

Referring to FIG. 3, the display region DA of the display device 1 according to an embodiment may include a plurality of pixels PX1, PX2, and PX3. The plurality of pixels PX1, PX2, and PX3 may include a first pixel PX1 that emits light of a first color (e.g., red light having a peak wavelength in a range of about 610 nm to about 650 nm), a second pixel PX2 that emits light of a second color (e.g., green light having a peak wavelength in a range of about 510 nm to about 550 nm), and a third pixel PX3 that emits light of a third color (e.g., blue light having a peak wavelength in a range of about 430 nm to about 470 nm). The first pixel PX1, the second pixel PX2, and the third pixel PX3 may be alternately arranged in a matrix configuration. The plurality of pixels PX1, PX2, and PX3 may be disposed in a stripe configuration, but the present inventive concept is not limited thereto, and the plurality of pixels PX1, PX2, and PX3 may be arranged in various ways such as a PenTile configuration.

The plurality of pixels PX1, PX2, and PX3 may include emission regions LA1, LA2, and LA3 and non-emission regions LB. The emission regions LA1, LA2, and LA3 are defined as regions through which light from organic layers is emitted, and the non-emission regions LB are defined as regions through which light from the organic layers is not emitted. The non-emission regions LB may be disposed so as to surround the emission regions LA1, LA2, and LA3. The emission regions LA1, LA2, and LA3 and the non-emission region LB may be defined by a pixel defining film described later.

A wavelength of the light emitted from each of the plurality of pixels PX1, PX2, and PX3 may be adjusted by not only the light emitted from each of the emission regions LA1, LA2, and LA3, but also a wavelength conversion pattern or color filter disposed to overlap each of the emission regions LA1, LA2, and LA3. For example, a first emission region LA1 of the first pixel PX1, a second emission region LA2 of the second pixel PX2, and a third emission region LA3 of the third pixel PX3 all emit light of the same wavelength (e.g., blue light), and a color of light emitted from the corresponding pixel may be determined by the wavelength conversion pattern and/or the color filter disposed to overlap the corresponding pixel.

The non-display region NDA does not include the emission regions LA1, LA2, and LA3, or has substantially the same structure as the emission regions LA1, LA2, and LA3 but may include a dummy emission region controlled so as not to emit light, or include the emission regions LA1, LA2, and LA3 but the light emission in a display direction may be blocked by a light-blocking layer which prevent light emitted from the emission regions LA1, LA2, and LA3 from being emitted to outside.

A plurality of first pattern portions 70a of the optical path change layer 70 may be disposed to overlap the emission regions LA1, LA2, and LA3 of the display device 1. For example, each of the plurality of first pattern portions 70a may have the same area as areas of the individual emission regions LA1, LA2, and LA3, and may be disposed to correspond to each of the emission regions LA1, LA2, and LA3. The second pattern portion 70b may be disposed to surround the plurality of first pattern portions 70a. That is, each of the first pattern portions 70a is disposed to overlap each of the emission regions LA1, LA2, and LA3, and the second pattern portion 70b may be disposed to overlap the non-emission region LB which surrounds the first pattern portions 70a. However, the present inventive concept is not limited thereto, and as shown in FIG. 4, each of the first pattern portions 70a may have an area smaller than those of the individual emission regions LA1, LA2, and LA3, and may be disposed to correspond to each of the emission regions LA1, LA2, and LA3. That is, each of the first pattern portions 70a may be disposed to overlap a part of each of the emission regions LA1, LA2, and LA3, and the second pattern portion 70b may be disposed to overlap a part of each of the emission regions LA1, LA2, and LA3 and the non-emission region LB to surround the first pattern portion 70a. In addition, although not shown in the drawing, each of the first pattern portions 70a may have an area larger than that of each of the emission regions LA1, LA2, and LA3, and in this case, the first pattern portion 70a may be disposed to overlap the emission regions LA1, LA2, and LA3 and a part of the non-emission region LB.

Meanwhile, FIGS. 3 and 4 show that each of the first pattern portions 70a is disposed in correspondence to each of the emission regions LA1, LA2, and LA3, but this is an example, and the first pattern portions 70a may be disposed only in some of the emission regions LA1, LA2, and LA3 among the emission regions LA1, LA2, and LA3.

FIG. 5 is a cross-sectional view of the display device according to an embodiment taken along line V-V' in FIG. 3. FIG. 6 is an enlarged cross-sectional view of an organic layer of FIG. 5. FIG. 7 is a cross-sectional view showing a modified example of a structure shown in FIG. 6. FIG. 8 is a cross-sectional view showing another modified example of the structure shown in FIG. 6.

Referring to FIG. 5, the display device 1 may include the first substrate 10, the second substrate 30 facing the first substrate 10, and an optical path change layer 70 disposed between the first substrate 10 and the second substrate 30.

The first substrate 10 may include a first base part 110, a plurality of switching elements T1, T2, and T3, an insulating film 130, a pixel defining film 150, a plurality of organic light-emitting elements ED1, ED2, and ED3, and an encapsulation layer 170.

The first base part 110 may be made of a material having light transmittance. The first base part 110 may be a glass substrate or a plastic substrate.

At least one switching element T1, T2, or T3 may be disposed on each of the plurality of pixels PX1, PX2, and PX3 on the first base part 110. Although not shown in the drawings, a plurality of signal lines (e.g., a gate line, a data line, a power line, etc.) for transmitting signals to each of the switching elements T1, T2, and T3 may be further disposed on the first base part 110.

The insulating film 130 may be disposed on the plurality of switching elements T1, T2, and T3. The insulating film 130 may be made of an organic film. For example, the insulating film 130 may include an acrylic-based resin, an epoxy-based resin, an imide-based resin, an ester-based resin, or the like.

Pixel electrodes AE1, AE2, and AE3 may be respectively disposed on the plurality of pixels PX1, PX2, and PX3 on the insulating film 130. The plurality of pixel electrodes AE1, AE2, and AE3 may be disposed in the emission regions LA1, LA2, and LA3, respectively, and at least some of the pixel electrodes may extend to the non-emission region LB. The plurality of pixel electrodes AE1, AE2, and AE3 may be respectively connected to the switching elements T1, T2, and T3 through via holes formed through the insulating film 130.

In an embodiment, each of the plurality of pixel electrodes AE1, AE2, and AE3 may be an anode of the organic light-emitting element. Each of the plurality of pixel electrodes AE1, AE2, and AE3 may include a material having a high work function for easy hole injection. Each of the plurality of pixel electrodes AE1, AE2, and AE3 may include indium tin oxide (ITO), indium zinc oxide (IZO), zinc oxide (ZnO), indium oxide ($In_2O_3$), or the like. When the display device 1 is a top emission display device, each of the plurality of pixel electrodes AE1, AE2, and AE3 may further include a reflective metal layer. The reflective metal layer may include, for example, silver (Ag), magnesium (Mg), aluminum (Al), platinum (Pt), lead (Pd), gold (Au), nickel (Ni), neodium (Nd), iridium (Jr), chromium (Cr), lithium (Li), calcium (Ca), or mixtures thereof. In some embodiments, each of the plurality of pixel electrodes AE1, AE2, and AE3 may have a two-layer structure of ITO/Ag, Ag/ITO, ITO/Mg, or ITO/MgF, or a multi-layer structure such as ITO/Ag/ITO.

The pixel defining film 150 may be disposed on the pixel electrodes AE1, AE2, and AE3. The pixel defining film 150 may be disposed along a boundary of each of the plurality of pixels PX1, PX2, and PX3. The pixel defining film 150 may be formed in a lattice shape and include an opening at least partially exposing each of the plurality of pixel electrodes AE1, AE2, and AE3. As described above, the emission regions LA1, LA2, and LA3 and the non-emission region LB may be distinguished by a presence of the pixel defining film 150. That is, regions among the pixel electrodes AE1, AE2, and AE3 that is exposed by the pixel defining film 150 may become the emission regions LA1, LA2, and LA3, and a region covered by the pixel defining film 150 may become the non-emission region LB.

In some embodiments, the pixel defining film 150 may include an organic insulating material such as an acrylic-based resin (polyacrylates resin), an epoxy-based resin, a phenolic resin, a polyamide-based resin, a polyimide-based resin, an unsaturated polyester-based resin, a polyphenylene-based resin, a polyphenylene sulfide-based resin, or benzocyclobutene (BCB).

Organic layers OL1, OL2, and OL3 may be disposed on the pixel electrodes AE1, AE2, and AE3 exposed by the openings of the pixel defining film 150. FIGS. 6 to 8 show examples of the organic layers OL1, OL2, and OL3.

In FIGS. 6 to 8, only a stacked structure of a first organic layer OL1 among the organic layers OL1, OL2, and OL3 is shown, but the other organic layers OL2 and OL3 may have the same stacked structure.

Referring to FIG. 6, in an embodiment, the first organic layer OL1 may include a first hole transport layer HTL1 disposed on the first pixel electrode AE1, a first emission layer EL11 disposed on the first hole transport layer HTL1, and a first electron transport layer ETL1 disposed on the first emission layer EL11. In the embodiment, the first organic layer OL1 may include only one emission layer, for example, the first emission layer EL11 as the emission layer, and the first emission layer EL11 may be a blue emission layer. However, the stacked structure of the first organic layer OL1 is not limited to the structure of FIG. 6 and may also be modified as shown in FIGS. 7 and 8.

Referring to FIG. 7, a first organic layer OL1a may further include a first charge generation layer CGL11 disposed on the first emission layer EL11 and a second emission layer EL12 disposed on the first charge generation layer CGL11, and the first electron transport layer ETL1 may be disposed on the second emission layer EL12.

The first charge generation layer CGL11 may serve to inject charges into each adjacent emission layer. The first charge generation layer CGL11 may serve to control a charge balance between the first emission layer EL11 and the second emission layer EL12. In some embodiments, the first charge generation layer CGL11 may include an n-type charge generation layer and a p-type charge generation layer. The p-type charge generation layer may be disposed on the n-type charge generation layer.

The second emission layer EL12 is not limited thereto but may emit blue light like the first emission layer EL11. The second emission layer EL12 may emit blue light having the same peak wavelength as the first emission layer EL11 or a different peak wavelength. In another embodiment, the first emission layer EL11 and the second emission layer EL12 may emit light of different colors. That is, the first emission layer EL11 may emit blue light, while the second emission layer EL12 may emit green light.

The first organic layer OL1a having the above-described structure includes two emission layers so that luminous efficiency and lifetime may be improved compared to the structure of FIG. 6.

FIG. 8 illustrates that a first organic layer OL1b may include three emission layers EL11, EL12, and EL13 and two charge generation layers CGL11 and CGL12 interposed between adjacent emission layers.

As shown in FIG. 8, the first organic layer OL1b may further include the first charge generation layer CGL11 disposed on the first emission layer EL11, the second emission layer EL12 disposed on the first charge generation layer CGL11, a second charge generation layer CGL12 disposed on the second emission layer EL12, and a third emission layer EL13 disposed on the second charge generation layer CGL12. The first electron transport layer ETL1 may be disposed on the third emission layer EL13.

The third emission layer EL13 may emit blue light like the first emission layer EL11 and the second emission layer EL12. In an embodiment, the first emission layer EL11, the second emission layer EL12, and the third emission layer EL13 may each emit blue light, but the peaks of wavelengths may all be the same, or some of the peaks may be different. In another embodiment, emission colors of the first emission layer EL11, the second emission layer EL12, and the third emission layer EL13 may be different. For example, each emission layer may emit blue or green light, or each emission layer may emit red, green, and blue light, respectively, to emit white light as a whole.

Referring again to FIG. 5, each of the organic layers OL1, OL2, and OL3 in each of the pixels PX1, PX2, and PX3 may be separated from each other. For example, the organic layers OL1, OL2, and OL3 are respectively disposed on the pixel electrodes AE1, AE2, and AE3 exposed by the openings of the pixel defining film 150, thereby being separated from each other by the pixel defining film 150. However, the present inventive concept is not limited thereto, and in another embodiment, a first organic layer OL1c, a second organic layer OL2c, and a third organic layer OL3c may be connected to each other, and in this case, since it is not necessary to perform a separation process for forming each of the organic layers OL1, OL2, and OL3 which are disposed in each of the pixels PX1, PX2, and PX3, process efficiency may be improved. In still another embodiment, some of the stacked layers of the organic layers OL1, OL2, and OL3 are separated from each other in each of the pixels PX1, PX2, and PX3, and the rest may be connected to each other regardless of the pixels PX1, PX2, and PX3. For example, the emission layer of each of the organic layers OL1, OL2, and OL3 is separated from each other in each pixel PX1, PX2, PX3, but the hole transport layer and/or electron transport layer may be formed to be connected to each other to form a common layer.

A common electrode CE is disposed on the organic layers OL1, OL2, and OL3. The common electrode CE may be disposed on the whole surface of the first substrate 10 to cover all of the pixels PX1, PX2, and PX3.

When the pixel electrodes AE1, AE2, and AE3 are anodes of the organic light-emitting elements, the common electrode CE becomes a cathode of the organic light-emitting element, and the common electrode CE may include a material having a low work function for easy electron injection, for example, Li, Ca, LiF/Ca, LiF/Al, Al, Mg, Ag, Pt, Pd, Ni, Au, Nd, Ir, Cr, BaF, Ba, or compounds or mixtures thereof (e.g., mixture of Ag and Mg, etc.).

When the display device 1 is a top emission display device, the common electrode CE may have transmissive or semi-transmissive properties. When the material having a low work function is formed to be thin with a thickness of tens to hundreds of angstroms, the common electrode CE may have the transmissive or semi-transmissive properties. When using a metal thin film having a low work function, in order to lower resistance while securing transmittance, the common electrode CE may further include a transparent conductive material layer such as tungsten oxide ($W_xO_x$), titanium oxide ($TiO_2$), indium tin oxide (ITO), indium zinc oxide (IZO), zinc oxide (ZnO), indium tin zinc oxide (ITZO), or magnesium oxide (MgO) stacked on the metal thin film.

The first pixel electrode AE1, the first organic layer OL1, and the common electrode CE described above may form a first organic light-emitting element ED1, the second pixel electrode AE2, the second organic layer OL2, and the common electrode CE may form a second organic light-emitting element ED2, and the third pixel electrode AE3, the third organic layer OL3, and the common electrode CE may form a third organic light-emitting element ED3.

The encapsulation layer 170 is disposed on the common electrode CE. The encapsulation layer 170 may be disposed on the organic light-emitting elements ED1, ED2, and ED3 to prevent impurities or moisture from infiltrating from the outside and may be disposed to seal the first substrate 10.

The encapsulation layer 170 may be disposed on a whole surface to cover all of the pixels PX1, PX2, and PX3. In an embodiment, the encapsulation layer 170 may directly cover the common electrode CE. In another embodiment, a capping layer covering the common electrode CE may be further disposed between the encapsulation layer 170 and the common electrode CE, and in this case, the encapsulation layer 170 may directly cover the capping layer.

The encapsulation layer 170 may include a first encapsulation inorganic film 171, an encapsulation organic film 173, and a second encapsulation inorganic film 175 sequentially stacked on the common electrode CE.

Each of the first encapsulation inorganic film 171 and the second encapsulation inorganic film 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

The encapsulation organic layer 173 may be made of an acrylic-based resin, a methacrylic-based resin, polyisoprene, a vinyl-based resin, an epoxy resin-based, a urethane-based resin, a cellulose-based resin, a perylene-based resin, or the like.

However, a structure of the encapsulation layer 170 is not limited to the above-described example, and in addition, the stacked structure of the encapsulation layer 170 may be variously changed.

The second substrate 30 may include a second base part 310, first to third light-blocking layers BM1, BM2, and BM3, a color filter layer 330, wavelength conversion patterns 341 and 343, a light transmission pattern 345, and a capping layer PS.

In the second substrate 30, light-emitting regions PA1, PA2, and PA3 and non-light emitting region PB may be defined. The light-emitting regions PA1, PA2, and PA3 are regions in which light is emitted to the outside, and the non-light emitting region PB is defined as a region in which light is not emitted to the outside and is blocked. The non-light emitting region PB may be disposed to surround the light-emitting regions PA1, PA2, and PA3. The light-emitting regions PA1, PA2, and PA3 may overlap the above-described emission regions LA1, LA2, and LA3. The non-light emitting region PB may overlap the non-emission region LB in a plan view. Areas of the light-emitting regions PA1, PA2, and PA3 may be larger than those of the emission regions LA1, LA2, and LA3 in a plan view, and an area of the non-light emitting region PB may be smaller than that of the non-emission region LB in a plan view.

The second base part 310 may be made of a material having light transmittance. The second base part 310 may be a glass substrate or a plastic substrate.

The first light-blocking layer BM1 may be disposed on the second base part 310. The first light-blocking layer BM1 may be disposed along a boundary of each of the pixels PX1, PX2, and PX3. For example, the first light-blocking layer BM1 may have a substantially lattice shape in a plan view and may prevent color mixing between adjacent pixels PX1, PX2, and PX3.

The first light-blocking layer BM1 may include a first light-blocking portion BM1a and a second light-blocking portion BM1b disposed on the first light-blocking portion BM1a. The first light-blocking layer BM1 may be disposed to cover boundary portions between adjacent color filter patterns 331, 333, and 335. The first light-blocking layer BM1 may be disposed between the second base part 310 and color filter patterns 331, 333, and 335.

The first light-blocking portion BM1a may be disposed on one surface of the second base part 310. The first light-blocking portion BM1a may transmit light of a third color and may absorb and block light of a first color and light of a second color. That is, the first light-blocking portion BM1a may be an absorption filter that transmits blue light but absorbs and blocks red light and green light. For example, the first light-blocking portion BM1a may be formed of a blue color filter and may include a blue colorant.

The second light-blocking portion BM1b may overlap the first light-blocking portion BM1a. The second light-blocking portion BM1b may block the transmission of light by absorbing or reflecting light incident on the second light-blocking portion BM1b. A width of the second light-blocking portion BM1b may be narrower than a width of the first light-blocking portion BM1a. However, the present inventive concept is not limited thereto. In other embodiments, the width of the first light-blocking portion BM1a may be narrower than the width of the second light-blocking portion BM1b, and the width of the first light-blocking portion BM1a and the width of the second light-blocking portion BM1b may be the same.

The second light-blocking portion BM1b may be formed of an organic material or a metal material including chromium. For example, the second light-blocking portion BM1b may be formed of a carbon black or organic black matrix, but the present inventive concept is not limited thereto. In addition, a thickness of the first light-blocking layer BM1 may be 2 μm, but the present inventive concept is not limited thereto.

In an embodiment, the areas of the light-emitting regions PA1, PA2, and PA3 may be different from each other, and when the areas of the light-emitting regions PA1, PA2, and PA3 are different from each other, external light reflected by the display device may not be visually recognized as neutral black. For example, when an area of a third light-emitting region PA3 which is a region emitting blue light is narrow, the blue light reflected by the display device may also be small. Further, even when the areas of the light-emitting regions PA1, PA2, and PA3 are the same, the blue light reflected by the display device may be less than red light and green light reflected by the display device because the wavelength conversion pattern is not disposed in the third light-emitting region PA3. When blue light is insufficient in the reflected light, red light and green light other than the blue light are visually recognized relatively more, and thus the reflected light may be yellowish black as a whole.

In the embodiment, only blue light among the external light incident on the first light-blocking layer BM1 may transmit the first light-blocking portion BM1a and light of the remaining colors may be absorbed by the first light-blocking portion BM1a, and the blue external light transmitted through the first light-blocking portion BM1a may be incident on the second light-blocking portion BM1b. The blue external light incident on the second light-blocking portion BM1b may be absorbed by the second light-blocking portion BM1b, but some blue external light incident on the second light-blocking portion BM1b may be reflected by the second light-blocking portion BM1b. That is, the blue light reflected to the outside by the first light-blocking layer BM1 may increase and the color of the reflected light may be adjusted accordingly.

In addition, since light in a blue wavelength band is not easily visually recognized by the human eye, the visibility of the reflected light is smaller when the external light is incident on the blue first light-blocking portion BM1a and reflected to the outside than when the external light is directly incident on the black second light-blocking portion BM1b and reflected to the outside. Accordingly, in an embodiment of the present inventive concept, since the first light-blocking layer BM1 further includes the first light-blocking portion BM1a, the visibility of reflected light may be reduced, thereby improving image quality.

The configuration of the first light-blocking layer BM1 is an example and, in another embodiment, the first light-blocking layer BM1 may be formed in a single layer structure made of either the first light-blocking portion BM1a or the second light-blocking portion BM1b. In still another embodiment, the first light-blocking layer BM1 may be omitted.

The color filter layer 330 is disposed on the second base part 310 and the first light-blocking layer BM1. The color filter layer 330 may include a plurality of color filter patterns 331, 333, and 335. For example, the color filter layer 330 may include a first color filter pattern 331, a second color filter pattern 333, and a third color filter pattern 335. The first color filter pattern 331 may overlap the first light-emitting region PA1, the second color filter pattern 333 may overlap the second light-emitting region PA2, and the third color filter pattern 335 may overlap the third light-emitting region PA3.

The first to third color filter patterns 331, 333, and 335 may selectively transmit light of a specific color but absorb light of other colors. For example, the first color filter pattern 331 may transmit the light of the first color but may absorb and block the light of the second color and the light of the third color. As described above, the light of the first color may be the red light, the light of the second color may be the green light, and the light of the third color may be the blue light. That is, the first color filter pattern 331 may be a red color filter pattern that transmits the red light but absorbs and blocks the green light and the blue light, and may include a red colorant.

The second color filter pattern 333 may transmit the light of the second color but may absorb and block the light of the first color and the light of the third color. That is, the second color filter pattern 333 may be a green color filter pattern that transmits the green light but absorbs and blocks the red light and the blue light, and may include a green colorant.

The third color filter pattern 335 may transmit the light of the third color but may absorb and block the light of the first color and the light of the second color. That is, the third color filter pattern 335 may be a blue color filter pattern that transmits the blue light but absorbs and blocks the red light and the green light, and may include a blue colorant.

The boundary portion between each of the color filter patterns 331, 333, and 335 may be disposed in the non-light emitting region PB.

A first capping layer PS1 may be disposed on the color filter patterns 331, 333, and 335. The first capping layer PS1 may prevent impurities such as moisture or air from infiltrating from the outside to damage or contaminate wavelength conversion patterns 341 and 343, and the light transmission pattern 345. In addition, the first capping layer PS1 may prevent colorants included in each of the color filter patterns 331, 333, and 335 from diffusing to other components. In some embodiments, the first capping layer PS1 may be made of an inorganic material. For example, the first capping layer PS1 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

The wavelength conversion patterns 341 and 343 and the light transmission pattern 345 may be disposed on the first capping layer PS1.

A first wavelength conversion pattern 341 may be disposed in the first light-emitting region PA1 and may not be disposed in the second light-emitting region PA2 and the third light-emitting region PA3. An area of the first wavelength conversion pattern 341 may be formed larger than an area of the first light-emitting region PA1 but this is an example and the present inventive concept is not limited thereto. In another embodiment, the area of the first wavelength conversion pattern 341 and the area of the first light-emitting region PA1 may be the same, and in still another embodiment, the area of the first light-emitting region PA1 may be formed larger than the area of the first wavelength conversion pattern 341.

The first wavelength conversion pattern 341 may convert a peak wavelength of incident light into light of another specific peak wavelength to emit the light having the another specific peak wavelength. For example, the first wavelength conversion pattern 341 may convert blue light into red light in a range of about 610 nm to about 650 nm to emit the red light.

The first wavelength conversion pattern 341 may include a first base resin 341a and a first wavelength conversion material 341b dispersed in the first base resin 341a, and may further include a first scatterer 341c dispersed in the first base resin 341a.

The first base resin 341a is not particularly limited as long as it is a material that has high light transmittance and excellent dispersion properties for the first wavelength conversion material 341b and the first scatterer 341c. For example, the first base resin 341a may include an organic material such as an epoxy-based resin, an acrylic-based resin, a cardo-based resin, an imide-based resin, or the like.

The first wavelength conversion material 341b may convert a peak wavelength of incident light into another specific peak wavelength. Examples of the first wavelength conversion material 341b may include a quantum dot, a quantum rod, or a phosphor. The quantum dot may be particulate material that emits light of a specific wavelength while electrons transition from a conduction band to a valence band.

The quantum dot may be a semiconductor nano-crystalline material. The quantum dot has a specific band gap according to its composition and size, and thus it is possible to emit light having a specific wavelength after absorbing light. Examples of semiconductor nanocrystals of the quantum dot may include a group IV nanocrystal, a group II-VI compound nanocrystal, a group III-V compound nanocrystal, a group IV-VI nanocrystal, or combinations thereof.

For example, the group IV nanocrystal may be exemplified by a binary compound such as silicon (Si), germanium (Ge), silicon carbide (SiC), silicon-germanium (SiGe), or the like, but the present inventive concept is not limited thereto.

In addition, the group II-VI compound nanocrystal may be exemplified by a binary compound such as CdSe, CdTe, ZnS, ZnSe, ZnTe, ZnO, HgS, HgSe, HgTe, MgSe, MgS, or a mixture thereof, a ternary compound such as CdSeS, CdSeTe, CdSTe, ZnSeS, and ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof, or a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but the present inventive concept is not limited thereto.

In addition, the group III-V compound nanocrystal may be exemplified by a binary compound such as GaN, GaP, GaAs, GaSb, AlN, AlP, AlAs, AlSb, InN, InP, InAs, InSb, or a mixture thereof, a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof, or a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, but the present inventive concept is not limited thereto.

The group IV-VI nanocrystal may be exemplified by a binary compound such as SnS, SnSe, SnTe, PbS, PbSe, PbTe, or a mixture thereof, a ternary compound such as SnSeS, SnSeTe, SnSTe, PbSeS, PbSeTe, PbSTe, SnPbS, SnPbSe, SnPbTe, or a mixture thereof, or a quaternary compound such as SnPbSSe, SnPbSeTe, SnPbSTe, or a mixture thereof, but the present inventive concept is not limited thereto.

The quantum dot may have a core-shell structure including a core including the nanocrystal described above and a shell surrounding the core. The shell of the quantum dot may serve as a protective layer for maintaining semiconductor properties by preventing chemical modification of the core and/or a charging layer for imparting electrophoretic properties to the quantum dot. The shell may be a single layer or multiple layers. Examples of the shell of the quantum dot may include a metal or non-metal oxide, a semiconductor compound, or combinations thereof.

For example, the metal oxide or non-metal oxide may be exemplified by a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, or a ternary compound such as $MgAl_2O_4$, $CoFe_2O_4$, $NiFe_2O_4$, $CoMn_2O_4$, or the like, but the present inventive concept is not limited thereto.

In addition, the semiconductor compound may be exemplified by CdS, CdSe, CdTe, ZnS, ZnSe, ZnTe, GaAs, GaP, GaSb, HgS, HgSe, HgTe, InAs, InP, InSb, AlAs, AlP, AlSb, or the like, but the present inventive concept is not limited thereto.

Light emitted by the first wavelength conversion material 341b may have a spectrum full width at half maximum (FWHM) emission wavelength of about 45 nm or less, about 40 nm or less, or about 30 nm or less, and thus, it is possible to improve color purity and color reproducibility (gamut) of colors displayed by the display device. In addition, the light emitted by the first wavelength conversion material 341b may be emitted toward various directions regardless of an incident direction of incident light. Thus, side visibility of the display device may be improved.

Some of emission light L provided from the first organic light-emitting element ED1 may pass through the first wavelength conversion pattern 341 to be emitted without being converted into red light by the first wavelength conversion material 341b. Components that are not converted by the first wavelength conversion pattern 341 and are incident on the first color filter pattern 331 may be blocked by the first color filter pattern 331. On the other hand, the red light converted by the first wavelength conversion pattern 341 may pass through the first color filter pattern 331 to be emitted to the outside. Accordingly, first emission light L1 emitted from the first light-emitting region PA1 to the outside may be red light.

The first scatterer 341c may have an index different from that of the first base resin 341c and may form an optical refractive interface with the first base resin 341a. For example, the first scatterer 341c may be light scattering particles. The first scatterer 341a is not particularly limited as long as it is a material capable of scattering at least a part of transmitted light, and may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like, and examples of a material of the organic particles may include an acrylic-based resin, a urethane-based resin, and the like. The first scatterer 341c may scatter the light in a random direction regardless of the incident direction of the incident light without substantially converting a wavelength of the light passing through the first wavelength conversion pattern 341. Thus, a path length of the light passing through the first wavelength conversion pattern 341 may be increased, and color conversion efficiency by the first wavelength conversion material 341a may be increased.

In some embodiments, a thickness of the first wavelength conversion pattern 341 may range from 3 µm to 15 µm. A content of the first wavelength conversion material 341b included in the first wavelength conversion pattern 341 may be 10% to 60%. In addition, a content of the first scatterer 341c included in the first wavelength conversion pattern 341 may be 2% to 15%, but the present inventive concept is not limited thereto.

The second wavelength conversion pattern 343 may be disposed in the second light-emitting region PA2 and may not be disposed in the first light-emitting region PA1 and the third light-emitting region PA3. An area of the second wavelength conversion pattern 343 may be formed larger than an area of the second light-emitting region PA2 but this is an example and the present inventive concept is not limited thereto. In another embodiment, the area of the second wavelength conversion pattern 343 and the area of the second light-emitting region PA2 may be the same, and in still another embodiment, the area of the second light-emitting region PA2 may be formed larger than the area of the second wavelength conversion pattern 343.

The second wavelength conversion pattern 343 may convert a peak wavelength of the incident light into light of another specific peak wavelength to emit the light having the another specific peak wavelength. For example, the second wavelength conversion pattern 343 may convert blue light into green light in a range of about 510 nm to about 550 nm to emit the light.

The second wavelength conversion pattern 343 may include a second base resin 343a and a second wavelength conversion material 343b dispersed in the second base resin 343a, and may further include a second scatterer 343c dispersed in the second base resin 343a.

The second base resin 343a is not particularly limited as long as it is a material that has high light transmittance and excellent dispersion properties for the second wavelength conversion material 343b and the second scatterer 343c. For example, the second base resin 343a may include an organic material such as an epoxy-based resin, an acrylic-based resin, a cardo-based resin, an imide-based resin, or the like.

As described above, the second wavelength conversion material 343b may convert a peak wavelength of the incident light to another specific peak wavelength. The second wavelength conversion material 343b may convert blue light having a peak wavelength in the range of 430 nm to 470 nm into green light having a peak wavelength in the range of 510 nm to 550 nm.

Examples of the second wavelength conversion material 343b may include a quantum dot, a quantum rod, or a phosphor. A more specific description of the second wavelength conversion material 343b is substantially the same as or similar to that described above in the description of the first wavelength conversion material 341b, and thus the specific description will be omitted.

Both the first wavelength conversion material 341b and the second wavelength conversion material 343b may be formed of the quantum dots. In this case, a diameter of the quantum dot forming the first wavelength conversion material 341b may be larger than a diameter of the quantum dot forming the second wavelength conversion material 343b. For example, a size of the quantum dot of the first wavelength conversion material 341b may be about 55 Å to 65 Å. Further, a size of the quantum dot of the second wavelength conversion material 343b may be about 40 Å to 50 Å.

The light transmitted through the first wavelength conversion pattern 341 and the second wavelength conversion pattern 343 may be in an unpolarized state in which there is no polarization. The non-polarized light refers to light that is not composed of only a polarization component in a specific direction, that is, light that is not polarized only in a specific direction, in other words, light that is composed of a random polarization component. Natural light may be an example of the non-polarized light.

The second scatterer 343c may have a refractive index different from that of the second base resin 343a and may form an optical interface with the second base resin 343a. For example, the second scatterer 343c may be light scattering particles. A specific description of the second scatterer 343c other than above is substantially the same as or similar to the description of the first scatterer 341c, and thus the specific description will be omitted.

In some embodiments, a thickness of the second wavelength conversion pattern 343 may be 3 μm to 15 μm. A content of the second wavelength conversion material 343b included in the second wavelength conversion pattern 343 may be 10% to 60%. In addition, a content of the second scatterer 343c included in the second wavelength conversion pattern 343 may be 2% to 15%, but the present inventive concept is not limited thereto.

Emission light L emitted from the second organic light-emitting element ED2 may be provided in the second wavelength conversion pattern 343, and the second wavelength conversion material 343b may convert the emission light L provided from the second organic light-emitting element ED2 into green light having a single peak wavelength in the range of about 510 nm to about 550 nm to emit the green light.

Some of the emission light L provided from the second organic light-emitting element ED2 may pass through the second wavelength conversion pattern 343 to be emitted without being converted into green light by the second wavelength conversion material 343b, and the emission light L may be blocked by the second color filter pattern 333. On the other hand, the green light converted by the second wavelength conversion pattern 343 among the emission light L may pass through the second color filter pattern 333 to be emitted to the outside. Accordingly, second emission light L2 emitted from the second light-emitting region PA2 to the outside may be green light.

The light transmission pattern 345 may be disposed in the third light-emitting region PA3 and may not be disposed in the first light-emitting region PA1 and the second light-emitting region PA2. The light transmission pattern 345 may transmit incident light. The area of the light transmission pattern 345 may be larger than the area of the third light-emitting region PA3, but this is an example, and the present inventive concept is not limited thereto. In another embodiment, the area of the light transmission pattern 345 and the area of the third light-emitting region PA3 may be the same, and in still another embodiment, the area of the third light-emitting region PA3 may be larger than the area of the light transmission pattern 345.

The light transmission pattern 345 may further include a third base resin 345a and a third scatterer 345b dispersed in the third base resin 345a.

The third base resin 345a may be made of an organic material having high light transmittance and may be made of the same material as the first base resin 341a, or may include at least one of materials exemplified as constituent materials of the first base resin 341a.

The third scatterer 345b may have a refractive index different from that of the third base resin 345a and may form an optical interface with the third base resin 345a. For example, the third scatterer 345b may be light scattering particles. The third scatterer 345b is not particularly limited as long as it is a material capable of scattering at least a part of transmitted light, and may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like, and examples of a material of the organic particles may include an acrylic-based resin, a urethane-based resin, and the like. The third scatterer 345b may scatter light in a random direction regardless of the incident direction of the incident light without substantially converting a wavelength of the light passing through the light transmission pattern 345. Thus, side visibility of light passing through the light transmission pattern 345 may be improved.

The emission light L provided from the third organic light-emitting element ED3 may pass through the light transmission pattern 345 and the third color filter pattern 335 to be emitted to the outside. That is, third emission light L3 emitted from the third light-emitting region PA3 may have the same wavelength as the emission light L which is blue light emitted from the third organic light-emitting element ED3.

Although not shown in the drawings, in some embodiments, a low refraction layer may be further disposed between the first wavelength conversion pattern 341, the second wavelength conversion pattern 343, and the light transmission pattern 345 and the first capping layer PS1. The low refraction layer may be disposed over the first light-emitting region PA1, the second light-emitting region PA2, the third light-emitting region PA3, and the non-light emitting region PB. The low refraction layer may have a lower refractive index compared to the first wavelength conversion pattern 341, the second wavelength conversion pattern 343, and the light transmission pattern 345. For example, a difference in refractive index between the first wavelength conversion pattern 341, the second wavelength conversion pattern 343, and the light transmission pattern 345 and the low refraction layer may be 0.3 or more. The low refraction layer may include a base resin and particles dispersed in the base resin. The particles included in the low refraction layer may be at least one of zinc oxide (ZnO) particles, titanium dioxide ($TiO_2$) particles, hollow silica particles that are empty inside, silica particles that are not empty inside, nano silicate particles, and porogen particles.

The low refraction layer may re-reflect some of the light emitted from the first wavelength conversion pattern 341 and the second wavelength conversion pattern 343 toward the second base part 310 to the first wavelength conversion pattern 341 and the second wavelength conversion pattern 343 side. That is, the low refraction layer may improve light utilization efficiency and improve light efficiency of the display device by recycling at least a part of light emitted in a direction toward the second base part 310, A second capping layer PS2 may be disposed on the first wavelength conversion pattern 341 and the second wavelength conversion pattern 343. The second capping layer PS2 may cover the first wavelength conversion pattern 341 and the second wavelength conversion pattern 343, and in some embodiments, the second capping layer PS2 may be further disposed on the light transmission pattern 345 and may further cover the light transmission pattern 345. The second capping layer PS2 may seal the first wavelength conversion pattern 341 and the second wavelength conversion pattern 343 together with the first capping layer PS1, and accordingly, it is possible to prevent impurities such as moisture or air from infiltrating from the outside to damage or contaminate the first wavelength conversion pattern 341 and the second wavelength conversion pattern 343. In some embodiments, the second capping layer PS2 may be made of an inorganic material. The second capping layer PS2 may be made of the same material as the first capping layer 351 or may include at least one of materials mentioned in the description of the first capping layer 351.

The second light-blocking layer BM2 may be disposed on the second capping layer PS2. For example, the second light-blocking layer BM2 may be disposed between the wavelength conversion patterns 341 and 343 and the light transmission pattern 345. The second light-blocking layer BM2 may be disposed between the wavelength conversion patterns 341 and 343 and the light transmission pattern 345, and may cover a part of upper surfaces of the wavelength conversion patterns 341 and 343 and the light transmission pattern 345, and a thickness of the second light-blocking layer BM2 protruding from the upper surfaces of the wavelength conversion patterns 341 and 343 and the light transmission pattern 345 may be 1 μm. However, this is an example, and the second light-blocking layer BM2 may be disposed only on side surfaces of the wavelength conversion patterns 341 and 343 and the light transmission pattern 345.

The second light-blocking layer BM2 may overlap the first light-blocking layer BM1 in a thickness direction d3. However, the present inventive concept is not limited thereto. For example, the second light-blocking layer BM2 and the first light-blocking layer BM1 may be disposed in different regions in the thickness direction d3, and in this case, the second light-blocking layer BM2 and the first light-blocking layer BM1 may not overlap in the thickness direction d3 or may partially overlap. In addition, a width of the second light-blocking layer BM2 may be the same as the width of the first light-blocking portion BM1a of the first light-blocking layer BM1. However, the present inventive concept is not limited thereto, and the width of the second light-blocking layer BM2 may be the same as the width of the second light-blocking portion BM1b of the first light-blocking layer BM1, and the width of the second light-blocking layer BM2 may be formed narrower than the width of the second light-blocking portion BM1b of the first light-blocking layer BM1.

The second light-blocking layer BM2 may be a carbon black or organic black matrix, but the present inventive concept is not limited thereto. The second light-blocking layer BM2 may block light emitted to the side surfaces of the wavelength conversion patterns 341 and 343 and the light transmission pattern 345 to effectively prevent color mixing from occurring between the light-emitting regions PA1, PA2, and PA3.

The optical path change layer 70 may be disposed in the space between the second substrate 30 and the first substrate 10. The optical path change layer 70 may be disposed between the second capping layer PS2 and the encapsulation layer 170. The optical path change layer 70 may be made of a material capable of transmitting light. The optical path change layer 70 may serve as a buffer between the first substrate 10 and the second substrate 30.

The optical path change layer 70 may include the first pattern portion 70a and the second pattern portion 70b so that it is also possible to alter a movement path of the emission light L emitted from the first substrate 10 to the second substrate 30 in the light-emitting regions PA1, PA2, and PA3. In addition, the first pattern portion 70a may include a blue colorant and may transmit blue light, but may absorb and block red light and green light.

The first pattern portions 70a and the second pattern portions 70b of the optical path change layer 70 may be alternately disposed in a cross sectional view. In general, the first pattern portion 70a may be disposed to overlap each of the emission regions LA1, LA2, and LA3, and the second pattern portion 70b may be disposed to overlap the non-emission region LB. However, the present inventive concept is not limited thereto, and in another embodiment, the first pattern portion 70a may overlap the emission regions LA1, LA2, and LA3 and a part of the non-emission region LB, and the second pattern portion 70b may overlap a part of the non-emission region LB, and in still another embodiment, the first pattern portion 70a may overlap a part of the emission regions LA1, LA2, and LA3, and the second pattern portion 70b may overlap the non-emission region LB and a part of the emission regions LA1, LA2, and LA3, and in yet another embodiment, the first pattern portion 70a may be disposed to overlap each of the light-emitting regions PA1, PA2, and PA3, and the second pattern portion 70b may be disposed to overlap the non-light emitting region PB.

The first pattern portion 70a and the second pattern portion 70b may be formed of materials having different refractive indices. For example, the first pattern portion 70a may have a first refractive index and the second pattern portion 70b may have a second refractive index smaller than the first refractive index.

The first pattern portion 70a may be formed of a high refractive pattern including a blue colorant. For example, the first pattern portion 70a may be a blue high refractive pattern made of acryl, cardo, fluorine-containing polyurethane acrylate (F-PUA), or the like, but the present inventive concept is not limited thereto.

The second pattern portion 70b may be formed of a low refractive pattern. For example, the second pattern portion 70b may be an air gap and may include an inert gas such as nitrogen or argon, or a mixture of various types of gases.

The first pattern portion 70a may be made of a material having a refractive index greater than 1.4 in order to effectively generate total reflection at a boundary between the first pattern portion 70a and the second pattern portion 70b, but, when a difference in refractive index between the first pattern portion 70a and the second pattern portion 70b is equal to 0.3 or more, the refractive index of the first pattern portion 70a and the second pattern portion 70b is not limited to.

When the second pattern portion 70b includes the air gap or the gas mixture, the refractive index of the second pattern portion 70b may be substantially close to 1.0. That is, the difference in refractive index between the first pattern portion 70a and the second pattern portion 70b may be 0.4 or more, and total reflection may effectively occur at the boundary between the first pattern portion 70a and the second pattern portion 70b. In another embodiment, the second pattern portion 70b may include a low refractive material, not an air gap. The low refractive material may be made of a material having a refractive index higher than that of the air gap and lower than that of the first pattern portion 70a.

As described above, the optical path change layer 70 may prevent the emission light L emitted from each of the emission regions LA1, LA2, and LA3 from infiltrating into adjacent pixels PX1, PX2, and PX3 through the difference in refractive index between the first pattern portion 70a and the second pattern portion 70b, and simultaneously, may prevent the occurrence of color mixing of the display device 1 by allowing the emission light L to be emitted to the light-emitting regions PA1, PA2, and PA3 of the corresponding pixels PX1, PX2, and PX3, and may improve emission efficiency.

A thickness H of the optical path change layer 70 may be less than 5 μm, and preferably, the thickness H of the optical path change layer 70 may be less than 3 μm. Because the optical path change layer 70 may be formed as a thin film which is different from a conventional filler layer, it is possible to minimize the emission light L emitted from the emission regions LA1, LA2, and LA3 from traveling to the adjacent pixels PX1, PX2, and PX3.

In addition, since the optical path change layer 70 includes a blue colorant, the reflected external light may have a blue wavelength band which is not easily visible to the human eye, thereby effectively reducing the visibility of the reflected light.

The third light-blocking layer BM3 may be disposed on the encapsulation layer 170 of the first substrate 10. The third light-blocking layer BM3 may be disposed to overlap the second light-blocking layer BM2 and the second pattern portion 70b in the thickness direction d3. For example, the second light-blocking layer BM2 and the third light-blocking layer BM3 may overlap each other with the second pattern portion 70b disposed between the second light-blocking layer BM2 and the third light-blocking layer BM3. In addition, in an embodiment, the second light-blocking layer BM2 and the third light-blocking layer BM3 may be disposed to be spaced apart from each other in the thickness direction d3, and in another embodiment, the second light-blocking layer BM2 and the third light-blocking layers BM3 may be in direct contact with each other.

A width of the third light-blocking layer BM3 may be the same as the width of the second light-blocking layer BM2 and may be formed narrower than a width of the second pattern portion 70b. However, the present inventive concept is not limited thereto. In another embodiment, the width of the third light-blocking layer BM3 may be smaller than the width of the second light-blocking layer BM2 and the width of the second pattern portion 70b, and in still another embodiment, the width of the third light-blocking layer BM3 may be greater than the width of the second light-blocking layer BM2 and may be the same as the width of the second pattern portion 70b. In addition, in another embodiment, the third light-blocking layer BM3 may be omitted.

FIG. 9 is a partially enlarged view for describing an optical path in region A of FIG. 5.

Referring to FIGS. 5 and 9, each of the organic light-emitting elements ED1, ED2, and ED3 emits blue light, and the emission light L may travel toward the second substrate 30. As described above, the optical path change layer 70 may be disposed between the first substrate 10 and the second substrate 30. In addition, the optical path change layer 70 may include the first pattern portion 70a and the second pattern portion 70b, the first pattern portion 70a may overlap each of the emission regions LA1, LA2, and LA3, and the second pattern portion 70b may overlap the non-emission region LB. That is, the emission light L emitted from each of the organic light-emitting elements ED1, ED2, and ED3 may be incident on the first pattern portion 70a of the optical path change layer 70.

The light incident on the first pattern portion 70a may generally travel toward the second substrate 30 in each of the light-emitting regions PA1, PA2, and PA3, but some of light La, Lb, and Lc may travel toward the second pattern portion 70b in the first pattern portion 70a.

The first pattern portion 70a and the second pattern portion 70b may have different refractive indices and may form a boundary surface 70i. When mediums having different refractive indices meet each other at the boundary surface 70i, an optical interface is formed, and light incident on the boundary surface 70i may be refracted or reflected. Therefore, the light La, Lb, and Lc traveling from the first pattern portion 70a having a high refractive index to the second pattern portion 70b having a low refractive index may be refracted and transmitted to the second pattern portion 70b, or may be reflected to the first pattern portion 70a.

A traveling direction of the light may be determined according to incident angles θa, θb, and θc of the light incident on the boundary surface 70i between the first pattern portion 70a and the second pattern portion 70b. For example, when an incident angle θc of first incident light Lc is smaller than a critical angle at the boundary surface 70i, a part is reflected as first reflected light Lc', but a part may be transmitted to the second pattern portion 70b as first transmitted light Lc". When an incident angle θb of second incident light Lb is equal to the critical angle, the second incident light Lb is not reflected or refracted and may travel along the boundary surface 70i as critical light Lb'. When an incident angle θa of third incident light La is greater than the critical angle, the third incident light La is not refracted to be transmitted to the second pattern portion 70b and may be totally reflected at the boundary surface 70i to travel to the first pattern portion 70a as third reflected light La'. Here, the more light is totally reflected the more light may be concentrated to the first pattern portion 70a.

Here, the critical angle may be determined by the refractive indices of the first pattern portion 70a and the second pattern portion 70b. A magnitude of the critical angle becomes smaller as a difference between the refractive index of the first pattern portion 70a and the refractive index of the second pattern portion 70b increases. That is, the greater the difference in refractive index, the smaller the critical angle and the more light may be totally reflected.

In addition, since the optical path change layer 70 minimizes light dispersion to the second pattern portion 70b by structural or optical properties as described above, color mixing between adjacent pixels PX1, PX2, and PX3 may be prevented. Further, since the optical path change layer 70 may concentrate light to the first pattern portion 70a corresponding to each of the emission regions LA1, LA2, and LA3, a more improved light-emitting effect may be provided.

FIG. 10 is a cross-sectional view of the display device according to an embodiment taken along line X-X' of FIG. 3.

Referring to FIG. 10, the display device 1 may include the first substrate 10, the second substrate 30 disposed to face the first substrate 10, and the optical path change layer 70 disposed between the first substrate 10 and the second substrate 30.

A fourth color filter pattern 337 and a third wavelength conversion pattern 347 disposed to correspond to a fourth light-emitting region PA4 may be included in the second substrate 30. The fourth color filter pattern 337 and the third wavelength conversion pattern 347 may be different from the first color filter pattern 331 and the first wavelength conversion pattern 341, respectively. That is, in the first light-emitting region PA1, the first wavelength conversion pattern 341 may convert incident light into the light of the first color, and the first color filter pattern 331 may transmit the converted light of the first color. Therefore, the first light-emitting region PA1 may be a region in which the light of the first color is emitted to the outside. However, the fourth light-emitting region PA4 may be a region in which the light of the second color or the light of the third color is emitted to the outside, not the light of the first color. Hereinafter, the fourth light-emitting region PA4 is described as a region in which the light of the second color is emitted to the outside, but the present inventive concept is not limited thereto and may also be a region in which the light of the third color is emitted to the outside.

The third wavelength conversion pattern 347 of the fourth light-emitting region PA4 may convert incident light to the light of the second color. That is, the third wavelength conversion pattern 347 may be substantially the same as the second wavelength conversion pattern 343. The third wavelength conversion pattern 347 may include a fourth base resin 347a, a third wavelength conversion material 347b dispersed in the fourth base resin 347a, and a fourth scatterer 347c dispersed in the fourth base resin 347a. The fourth color filter pattern 337 may transmit the light of the second color converted by the third wavelength conversion pattern 347 but may absorb and block other light.

Fourth emission light L4 of the fourth light-emitting region PA4 may be light having a different color from the first emission light L1 of the first light-emitting region PAL That is, as described above, the optical path change layer 70 may be patterned into the first pattern portion 70a and the second pattern portion 70b in order to prevent color mixing from occurring between the first and four light-emitting regions PA1 and PA4.

The optical path change layer 70 may include the first pattern portion 70a and the second pattern portion 70b, wherein the first pattern portion 70a may overlap each of the emission regions LA1 and LA4, and the second pattern portion 70b may overlap the non-emission region LB. However, the present inventive concept is not limited thereto, and in another embodiment, the first pattern portion 70a may overlap each of the light-emitting regions PA1 and PA4, and the second pattern portion 70b may overlap the non-light emitting region PB.

Referring together to the plan view of FIG. 3 and the cross-sectional view of FIG. 5 and the cross-sectional view of FIG. 10, the first pattern portions 70a may be individually disposed for each of the emission regions LA1, LA2, LA3, and LA4. That is, the first pattern portions 70a overlapping each of the emission regions LA1, LA2, LA3, and LA4 may be spaced apart from each other. In other words, the first pattern portions 70a may be formed in an independent island shape for each of the emission regions LA1, LA2, LA3, and LA4 in a plan view.

The emission light L emitted from organic light-emitting elements ED1 and ED4 is incident on the optical path change layer 70, and as described in FIG. 9, since some light may not be transmitted to the second pattern portion 70b through the total reflection at the optical interface between the first pattern portion 70a and the second pattern portion 70b and may be concentrated to the first pattern portion 70a, the dispersion of light is minimized, thereby preventing color mixing between adjacent pixels PX1 and PX4 and improving the light-emitting effect.

FIG. 11 is a view for describing a path of emitted light of an organic light-emitting element in an embodiment. In describing the path of light, a vertical direction refers to the same direction as the third direction d3, and an adjacent pixel direction refers to the first direction d1 or an opposite direction of the first direction d1.

Referring to FIG. 11, the first organic light-emitting element ED1 disposed on the first pixel PX1 may output first emission light L11 incident onto the optical path change layer in a vertical direction and second emission light L12 incident onto the optical path change layer at a certain angle in a direction of the adjacent pixels PX1, PX2, and PX3.

The first emission light L11 is vertically incident onto the first pattern portion 70a and passes through the first wavelength conversion pattern 341 and the first color filter pattern 331 and may be output to the outside corresponding to the first pixel PX1 as the first emission light L1 (red light).

The second emission light L12 is incident onto the second pattern portion 70b with an angle smaller than the critical angle and is refracted in the vertical direction through an optical interface formed at a boundary between the encapsulation layer 170 and the second pattern portion 70b and is incident on the second pattern portion 70b. In addition, the second emission light L12 is refracted in a more vertical direction at the optical interface between the second pattern portion 70b and the first wavelength conversion pattern 341 to be incident on the first wavelength conversion pattern 341 and may be output to the outside corresponding to the first pixel PX1 as the first emission light L1 (red light) while passing through the first color filter pattern 331.

Thus, the path of the second emission light L12 is changed by the second pattern portion 70b which is a low refractive pattern of the optical path change layer 70 so that the second emission light L12 traveling in the direction of the adjacent pixels PX1, PX2, and PX3 in the first organic light-emitting element ED1 may be output as the first emission light L1.

The second organic light-emitting element ED2 disposed on the second pixel PX2 may output first emission light L21 incident onto the optical path change layer 70 in a vertical direction and second emission light L22 incident onto the optical path change layer 70 at a certain angle in the direction of the adjacent pixels PX1, PX2, and PX3.

The first emission light L21 may be incident onto the first pattern portion 70a in the vertical direction and may pass through the second wavelength conversion pattern 343 and the second color filter pattern 333 to be output to the outside corresponding to the second pixel PX2 as the second emission light L2 (green light).

The second emission light L22 is incident onto the first pattern portion 70a at an angle smaller than the critical angle in the direction of the adjacent pixels PX1, PX2, and PX3, and is refracted in the direction of the adjacent pixels PX1, PX2, and PX3 through an optical interface formed at a boundary between the encapsulation layer 170 and the first pattern portion 70a, and is refracted in a vertical direction at the optical interface formed between the first pattern portion 70a and the second pattern portion 70b to be incident onto the second pattern portion 70b at an angle smaller than the critical angle. In addition, the second emission light L22 may be refracted in a more vertical direction through an optical interface formed between the second pattern portion 70b and the second wavelength conversion pattern 343 to be incident on the second wavelength conversion pattern 343, and may be output to the outside corresponding to the second pixel PX2 as the second emission light L2 (green light) while passing through the second color filter pattern 333.

Thus, the path of the second emission light L22 is changed due to the difference in refractive index between the first pattern portion 70a and the second pattern portion 70b of the optical path change layer 70 so that the second emission light L22 traveling in the direction of the adjacent pixels PX1, PX2, and PX3 in the second organic light-emitting element ED2 may be output as the second emission light L2.

The third organic light-emitting element ED3 disposed on the third pixel PX3 may output first emission light L31 incident onto the optical path change layer 70 in the vertical direction and second emission light L32 incident on the optical path change layer 70 at a certain angle in the direction of the adjacent pixels PX1, PX2, and PX3.

The first emission light L31 is incident in a direction perpendicular to the first pattern portion 70a and passes through the light transmission pattern 345 and the third color filter pattern 335, and may be output to the outside corresponding to the third pixel PX3 as the third emission light L3 (blue light).

The second emission light L32 is incident onto the first pattern portion 70a at an angle smaller than the critical angle in the direction of the adjacent pixels PX1, PX2, and PX3, and is refracted in the direction of the adjacent pixels PX1, PX2, PX3. at an optical interface between the encapsulation layer 170 and the first pattern portion 70a, and is incident onto the optical interface between the first pattern portion 70a and the second pattern portion 70b at an angle greater than the critical angle to be totally reflected at the optical interface. In addition, the total reflected light passes through the light transmission pattern 345 and the third color filter pattern 335, and may be output to the outside corresponding to the third pixel PX3 as third emission light L3 (blue light).

Thus, the path of the second emission light L32 is changed abo by being totally reflected due to the difference in refractive index between the first pattern portion 70a and the second pattern portion 70b of the optical path change layer 70 so that the second emission light L32 traveling in the direction of the adjacent pixels PX1, PX2, and PX3 in the third organic light-emitting element ED3 may be output as the third emission light L3.

FIG. 12 is a view for describing a path of external light in an embodiment. For convenience of description, first to fifth external light W1, W2, W3, W4, and W5 incident onto the first pixel PX1, the second pixel PX2, and the third pixel PX3 are described as an example, and the first to fifth external light W1, W2, W3, W4, and W5 may be white light.

Referring to FIG. 12, the first external light W1 and the second external light W2 may be incident onto the first pixel PX1. The second external light W2 passes through the first color filter pattern 331 and the first wavelength conversion pattern 341 and is converted into red light R, and the converted red light R is absorbed in the first pattern portion 70a of the optical path change layer 70.

The first external light W1 passes through the first color filter pattern 331 and the first wavelength conversion pattern 341 and is converted into the red light R. A part of the converted red light R is absorbed in the first pattern portion 70a of the optical path change layer 70, and a part of the converted red light R is reflected from the first organic light-emitting element ED1, for example, the pixel electrode AE1 of the first organic light-emitting element ED1 and becomes reflected light because the path of light is changed to the outside, but is absorbed by the first pattern portion 70a that absorbs red light R and green light G. Thus, the first pattern portion 70a of the optical path change layer 70 includes a blue colorant and is disposed to overlap the first emission region LA1 so that the first external light W1 and the second external light W2 may be converted into the red light R by the first color filter pattern 331 and the first wavelength conversion pattern 341 to effectively block the reflected light emitted to the outside.

The third external light W3 and the fourth external light W4 may be incident onto the second pixel PX2. The fourth external light W4 passes through the second color filter pattern 333 and the second wavelength conversion pattern 343 and is converted into green light G, and the converted green light G is absorbed in the first pattern portion 70a of the optical path change layer 70.

The third external light W3 passes through the second color filter pattern 333 and the second wavelength conversion pattern 343 and is converted into the green light G. A part of the converted green light G is absorbed in the first pattern portion 70a of the optical path change layer 70 and a part of the converted green light G is reflected from the second organic light-emitting element ED2, for example, the pixel electrode AE2 of the second organic light-emitting element ED2 and becomes reflected light because the path of light is changed to the outside but is absorbed by the first pattern portion 70a that absorbs the red light R and the green light G. Thus, the first pattern portion 70a of the optical path change layer 70 includes a blue colorant and is disposed to overlap the second emission region LA2, so that the third external light W3 and the fourth external light W4 may be converted into the green light G by the second color filter pattern 333 and the second wavelength conversion pattern 343 to effectively block the reflected light emitted to the outside.

The fifth external light W5 may be incident onto the third pixel PX3. The fifth external light W5 passes through the third color filter pattern 335 and is converted into blue light B, the converted blue light B is reflected from the third organic light-emitting element ED3, for example, the pixel electrode AE3 of the third organic light-emitting element ED3 and becomes reflected light because the path of light is changed to the outside, a part of the reflected light is absorbed by the third light-blocking layer BM3, and a part of the reflected light is emitted to the outside. Since the light in the blue wavelength band is not easily visible to the human eye, the visibility of the reflected light is smaller than when the external light is directly incident on the black light-blocking layer and reflected to the outside.

Thus, in the optical path change layer of an embodiment, the first pattern portion includes the blue colorant and thus it is possible to remarkably reduce the reflected light as a whole.

FIG. 13 is a cross-sectional view of a display device of another embodiment, and FIG. 14 is a view for describing a path of emitted light of an organic light-emitting element in another embodiment.

FIG. 13 is different from the embodiment of FIG. 5 in that a first pattern portion of an optical path change layer is formed in an inverted trapezoidal shape. Hereinafter, a description overlapping the embodiment of FIG. 5 will be omitted and the description will be mainly focused on differences.

An optical path change layer 70_1 may be disposed in a space between the second substrate 30 and the first substrate 10. The optical path change layer 70_1 may include a first pattern portion 70a_1 and a second pattern portion 70b_1. The first pattern portions 70a_1 may be disposed in plural and may be disposed to be spaced apart from each other. The second pattern portion 70b_1 may be disposed in a space between adjacent first pattern portions 70a_1 and the second pattern portion 70b_1 may be an air gap and may be a low refractive pattern including an inert gas such as nitrogen, argon, or the like, or including mixtures of various types of gases, and a shape of the second pattern portion 70b_1 may be changed depending on a shape of the first pattern portion 70a_1.

The first pattern portion 70a_1 may be formed in an inverted trapezoidal shape in a cross sectional view. Specifically, the first pattern portion 70a_1 may include a first surfacea1 in contact with the first substrate 10, a second surfacea2 in contact with the second substrate 30, and third and fourth surfacesa3 and a4 which are side surfaces connecting the first surfacea1 and the second surfacea2, and an area of the second surfacea2 is formed larger than an area of the first surfacea1. In addition, an angle θ1 formed between the first surfacea1 and the third surfacea3 or the fourth surfacea4 may be an obtuse angle.

The first pattern portions 70a_1 and the second pattern portions 70b_1 of the optical path change layer 70_1 may be alternately disposed in a cross section. The first pattern portion 70a_1 may be disposed to overlap each of the emission regions LA1, LA2, and LA3. For example, the second surfacea2 of the first pattern portion 70a_1 may be disposed to overlap each of the emission regions LA1, LA2, and LA3. However, the present inventive concept is not limited thereto, and the first surfacea1 of the first pattern portion 70a_1 may be disposed to overlap each of the emission regions LA1, LA2, and LA3. Thus, the first pattern portion 70a_1 has the inverted trapezoidal shape so that an optical interface between the first pattern portion 70a_1 and the second pattern portion 70b_1 may have a constant slope, and thus it is possible to more effectively change the path of the emission light L output from the organic light-emitting elements ED1, ED2 and ED3 in the vertical direction.

Referring to FIG. 14, the first pattern portion 70a_1 has the inverted trapezoidal shape so that the optical interface between the first pattern portion 70a_1 and the second pattern portion 70b_1 is inclined outward. Since light incident on the first pattern portion 70a_1 and traveling to the second pattern portion 70b_1 is totally reflected at the optical interface between the first pattern portion 70a_1 and the second pattern portion 70b_1, the path of the incident light may be changed to a more vertical direction through the optical interface inclined outward. The path of the emitted light output from the organic light-emitting elements ED1, ED2, and ED3 has been described above, and thus a duplicate description is omitted.

FIG. 15 is a cross-sectional view of a display device according to another embodiment. FIG. 15 is different from the embodiment of FIG. 5 in that the structure of the second substrate is different. Hereinafter, a description having the same configuration as the embodiment of FIG. 5 will be omitted, and the description will be mainly focused on differences.

Referring to FIG. 15, unlike the second substrate 30 shown in FIG. 5, a second substrate 30_1 may include a planarization layer OC, a third capping layer PS3, and a second light-blocking layer BM2_1.

The first light-blocking layer BM1 may include the first light-blocking portion BM1a and the second light-blocking portion BM1b. The first light-blocking layer BM1 may be disposed between the boundary portion of each of the color filter patterns 331, 333, and 335 and the second base part 310. The first light-blocking layer BM1 is the same as the embodiment of FIG. 5, and thus a specific description is omitted.

In the second substrate 30_1 according to another embodiment, the planarization layer OC may be further disposed on the second capping layer PS2. When thicknesses between the first wavelength conversion pattern 341, the second wavelength conversion pattern 343, and the light transmission pattern 345 are different from each other to form an uneven surface or when there is a space between the components, the uneven surface may be planarized by the planarization layer OC.

A material of the planarization layer OC is not particularly limited as long as it has transparency and planarization characteristics. In an embodiment, the planarization layer OC may include an organic material. For example, the organic material may include a cardo-based resin, a polyimide-based resin, an acrylic-based resin, a siloxane-based resin, a silsesquioxane-based resin, or the like.

The third capping layer PS3 may be further disposed on the planarization layer OC. The third capping layer PS3 may completely cover the planarization layer OC. The third capping layer PS3 may be made of an inorganic material. The third capping layer PS3 may be made of the same material as the first capping layer PS1 or may include at least one of materials mentioned in the description of the first capping layer PS1.

The second light-blocking layer BM2_1 may be disposed on the third capping layer PS3. The second light-blocking layer BM2_1 may be disposed to overlap the first light-blocking layer BM1 and may prevent color mixing between the adjacent pixels PX1, PX2, and PX3. The first light-blocking layer BM1 may be disposed between the second base part 310 and the wavelength conversion patterns 341 and 343 and between the second base part 310 and the light transmission pattern 345, while the second light-blocking layer BM2_1 may be disposed between the wavelength conversion patterns 341 and 343 and the light transmission pattern 345, and the organic light-emitting elements ED1, ED2, and ED3. A thickness of the second light-blocking layer BM2_1 may be smaller than a thickness of each wavelength conversion pattern 341 and 343 and the light transmission pattern 345 but the present inventive concept is not limited thereto.

The second light-blocking layer BM2_1 may be disposed on the other surface of the third capping layer PS3 different from one surface of the third capping layer PS3 in contact with the planarization layer OC.

The second light-blocking layer BM2_1 may absorb or reflect light of all colors to block transmission. The second light-blocking layer BM2_1 may be disposed in a substantially lattice shape in a plan view, and it is possible to prevent light from infiltrating between the adjacent pixels and causing color mixing.

The second light-blocking layer BM2_1 may be formed of one of the materials described for the second light-blocking portion BM1b of the first light-blocking layer BM1, but in some embodiments, the second light-blocking layer BM2_1 may be formed of the same material as the first light-blocking portion BM1a.

FIG. 16 is a cross-sectional view of a display device according to another example. FIG. 16 is different from the embodiment of FIG. 5 in that a first light-blocking layer is a single layer structure made of an organic material. Hereinafter, a description having the same configuration as the embodiment of FIG. 5 will be omitted and the description will be mainly focused on differences.

Referring to FIG. 16, a second substrate 30_2 may include a first light-blocking layer BM1_1 and a second light-blocking layer BM2_1.

The first light-blocking layer BM1_1 may be disposed on the second base part 310. Unlike the embodiment of FIG. 5, the first light-blocking layer BM1_1 may be an organic black matrix including an organic material. The first light-blocking layer BM1_1 is disposed between the second base part 310 and the wavelength conversion patterns 341 and 343 and between the second base part 310 and the light transmission pattern 345, and is disposed along the boundary of the pixels PX1, PX2, and PX3, and thus it is possible to prevent light from infiltrating between the adjacent pixels PX1, PX2, and PX3 and causing color mixing. In addition, the organic first light-blocking layer BM1_1 has an advantage of having heat resistance, light resistance, chemical resistance, and high adhesion strength to the second base part 310.

The second light-blocking layer BM2_1 may be disposed on the third capping layer PS3 and may be made of a carbon black matrix. The second light-blocking layer BM2_1 is disposed between the wavelength conversion patterns 341 and 343 and the light transmission patterns 345, and the organic light-emitting elements ED1, ED2, and ED3, and is disposed along boundaries of the pixels PX1, PX2, and PX3, and thus it is possible to prevent light from infiltrating between the adjacent pixels PX1, PX2, and PX3 and causing color mixing. In addition, the first light-blocking layer BM1_1 and the second light-blocking layer BM2_1 may be disposed to overlap each other in the thickness direction d3.

FIG. 17 is a schematic plan view of a display device according to another embodiment, and FIG. 18 is a cross-sectional view taken along line XVIII-XVIII' in FIG. 17. The embodiment of FIGS. 17 and 18 are different from the embodiment of FIG. 5 in that a first pattern portion of an optical path change layer is composed of a plurality of high refractive portions and a plurality of low refractive portions. Hereinafter, a description having the same configuration as the embodiment of FIG. 5 will be omitted and the description will be mainly focused on differences.

Referring to FIGS. 17 and 18, an optical path change layer 70_2 according to another embodiment may include a first pattern portion 70a and a second pattern portion 70b.

The first pattern portion 70a may be disposed to overlap the emission regions LA1, LA2, and LA3 to correspond to each of the emission regions LA1, LA2, and LA3 in a plan view. The second pattern portion 70b may be disposed to surround the first pattern portion 70a. That is, the first pattern portion 70a may be disposed to overlap each of the emission regions LA1, LA2, and LA3, and the second pattern portion 70b may be disposed to overlap the non-emission region LB to surround the first pattern portions 70a.

The first pattern portion 70a may include a plurality of high refractive portions 70a1 which are high refractive patterns that include a blue colorant, and low refractive portions 70a2 disposed between the plurality of high refractive portions 70a1. Each of the plurality of high refractive portions 70a1 may have a bar shape and may be disposed to be separated, and the low refractive portions 70a2 may be disposed in each separation space between the plurality of high refractive portions 70a1. Thus, the first pattern portion 70a including the plurality of high refractive portions 70a1 and the plurality of low refractive portions 70a2 may be disposed to correspond to each of the emission regions LA1, LA2, and LA3 of each pixel PX1, PX2, and PX3, and the second pattern portion 70b may be disposed to surround the outside of the first pattern portion 70a.

The number and size of the high refractive portions 70a1 and the low refractive portions 70a2 included in the first pattern portion 70a may be variously formed according to the size of the emission region.

Each of the high refractive portions 70a1 may include acryl, a cardo-based resin, and fluorine-containing polyurethane acrylate (F-PUA). In addition, the high refractive portion 70a1 may include a blue colorant. Each of the low refractive portions 70a2 may be an air gap and may be a gas including an inert gas such as nitrogen or argon or a mixture of various types of gases. The refractive index of the high refractive portion 70a1 may be greater than 1.4, and the refractive index of the low refractive portion 70a2 may be close to 1.0.

An upper surface of the high refractive portion 70a1 may be in contact with the second substrate 30, and the lower surface of the high refractive portion 70a1 may be in contact with the first substrate 10. The low refractive portion 70a2 and the second pattern portion 70b may have the same material and the same refractive index. For example, the second pattern portion 70b may be disposed between the high refractive portion 70a1 closest to the second pixel PX2 among the plurality of high refractive portions 70a1 disposed in the first emission region LA1 of the first pixel PX1 and the high refractive portions 70a1 closest to the first pixel PX1 among the plurality of high refractive portions 70a1 disposed in the second emission region LA2 of the second pixel PX2, and the low refractive portions 70a2 may be disposed between the plurality of high refractive portions 70a1 disposed on each of the pixels PX1.PX2. and PX3.

A width of the high refractive portion 70a1 and a width of the low refractive portion 70a2 of the first pattern portion 70a may be the same but the present inventive concept is not limited thereto. For example, the width of the high refractive portion 70a1 may be larger than the width of the low refractive portion 70a2 and the width of the low refractive portion 70a2 may be larger than the width of the high refractive portion 70a1. Thus, when the plurality of high refractive portions 70a1 and the plurality of low refractive portions 70a2 are disposed in the first pattern portion 70a, not only an optical interface between the first pattern portion 70a and the second pattern portion 70b but also optical interfaces between the plurality of high refractive portions 70a1 and the plurality of low refractive portions 70a2 are formed in the first pattern portion 70a, and a path of the emission light L output from each of the pixels PX1.PX2. and PX3 may be changed in a vertical direction through a plurality of optical interfaces, thereby more effectively preventing color mixing between the adjacent pixels PX1.PX2.andPX3.

FIG. 19 is a schematic cross-sectional view of a display device according to another embodiment. The embodiment of FIG. 19 is different from the embodiment of FIG. 18 in that shapes of high and low refractive portions are differently formed. Hereinafter, a description having the same configuration as the embodiment of FIG. 18 will be omitted and the description will be mainly focused on differences.

Referring to FIG. 19, an optical path change layer 70_3 according to another embodiment may include a first pattern portion 70a and a second pattern portion 70b. The first pattern portion 70a may include a plurality of high refractive portions 70a1 which are high refractive patterns that include a blue colorant, and low refractive portions 70a2 disposed between the plurality of high refractive portions 70a1.

Each of the high refractive portions 70a1 may have an inverted trapezoidal shape in a cross sectional view and may be disposed to be spaced apart. Specifically, the high refractive portion 70a1 may include a lower surface a1 contacting the first substrate 10, an upper surface a2 contacting the second substrate 30, and first and second side surfaces a3 and a4 connecting the lower surface a1 and the upper surface a2, and an area of the upper surface a2 may be formed larger than an area of the lower surface a1. In addition, an angle θ2 formed between the lower surface a1 and the first side surface a3 or the second side surface a4 may be an obtuse angle. Since the low refractive portions 70a2 is disposed in a separation space between the high refractive portions 70a1, a shape of the low refractive portion 70a2 depends on the shape of the high refractive portion 70a1. Therefore, when the high refractive portion 70a1 has the inverted trapezoidal shape, the low refractive portion 70a2 disposed between the high refractive portions 70a1 may have a trapezoidal shape.

Compared to the embodiment of FIG. 18, in the embodiment of FIG. 19, the high refractive portion 70a1 has the inverted trapezoidal shape, so that an optical interface between the high refractive portion 70a1 and the low refractive portion 70a2 may have a constant slope, and the path of the emission light L output from the organic light-emitting elements ED1, ED2, and ED3 may be changed more effectively in the vertical direction, and thus color mixing between the adjacent pixels PX1.PX2.and PX3 may be more effectively prevented.

Hereinafter, various forms of the optical path change layer will be described. Hereinafter, the high refractive pattern refers to a pattern having a refractive index of 1.4 or more which includes a blue colorant and the low refractive pattern refers to an air gap or a pattern made of a gas having a refractive index close to the air gap.

FIGS. 20 and 21 are schematic plan views of display devices according to another embodiment.

Referring to FIGS. 20 and 21, optical path change layers 70_4 and 70_5 according to another embodiment may include a first pattern portion 70a, a second pattern portion 70b, and a third pattern portion 70c. The first pattern portion 70a may be a high refractive pattern disposed in an island shape in each of the emission regions LA1, LA2, and LA3, and the second pattern portion 70b may be a low refractive pattern disposed in the non-emission region LB. The third pattern portion 70c may be a low refractive pattern disposed in a lattice shape surrounding a plurality of first pattern portions 70a in each of the emission regions LA1, LA2, and LA3. As shown in FIG. 20, the plurality of first pattern portions 70a may be disposed in a matrix configuration, and as shown in FIG. 21, the plurality of first pattern portions 70a may be disposed in a matrix configuration. The plurality of first pattern portions 70a in odd numbered rows and the plurality of first pattern portions 70a in even numbered rows may be disposed in different columns. However, the present inventive concept is not limited thereto, and the plurality of first pattern portions 70a having the island shape may be irregularly disposed, and the plurality of first pattern portions 70a may be disposed with different sizes.

Thus, the optical path change layers 70_4 and 70_5 include the plurality of first pattern portions 70a disposed in the island shape, and thus color mixing between the adjacent pixels PX1, PX2, and PX3 may be more effectively prevented by maximizing an optical interface formed between the first pattern portion 70a and the third pattern portion 70c.

FIG. 22 is a schematic plan view of a display device according to another embodiment.

Referring to FIG. 22, an optical path change layer 70_6 according to another embodiment may include a first pattern portion 70a, a second pattern portion 70b, and a third pattern portion 70c. The first pattern portion 70a may be a high refractive pattern having a rectangular shape disposed in each of the emission regions LA1, LA2, and LA3, and the second pattern portion 70b may be a low refractive pattern disposed in the non-emission region LB. The third pattern portion 70c may be a low refractive pattern surrounding a plurality of first pattern portions 70a in each of the emission regions LA1, LA2, and LA3. The plurality of first pattern portions 70a may be disposed in different numbers in odd numbered columns and even numbered columns. However, the present inventive concept is not limited thereto. For example, the plurality of first pattern portions 70a having the rectangular shape may be irregularly disposed, and each of the plurality of first pattern portions 70a having the rectangular shape may be disposed to have different sizes.

FIGS. 23 and 24 are schematic plan views of display devices according to another embodiment.

Referring to FIGS. 23 and 24, an optical path change layer 70_7 of FIG. 23 and an optical path change layer 70_8 of FIG. 24 may each include a first pattern portion 70a, a second pattern portion 70b, and a third pattern portion 70c. The first pattern portion 70a may include a first sub-pattern SB1 which is a high refractive pattern having a rectangular shape and a second sub-pattern SB2 which is a high refractive pattern having a bar shape which are disposed in each of the emission regions LA1, LA2, and LA3, and the second pattern portion 70b may be a low refractive pattern disposed in the non-emission region LB, and the third pattern portion 70c may be a low refractive pattern surrounding the first sub-pattern SB1 and the second sub-pattern SB2 in each of the emission regions LA1, LA2, and LA3. In a plurality of first sub-patterns SB1 and the second sub-pattern SB2, the second sub-pattern SB2 having a bar shape as shown in FIG. 23 may be disposed at the center portion of each of the emission regions LA1, LA2, and LA3 and the second sub-pattern SB2 having a bar shape as shown in FIG. 24 may be disposed at the outer portion of each of the emission regions LA1, LA2, and LA3. However, the present inventive concept is not limited thereto, and the first sub-pattern SB1 and the second sub-pattern SB2 may be irregularly disposed, and each of the plurality of first sub-patterns SB1 may have different sizes. Each of the plurality of second sub patterns SB2 may be disposed to have different sizes.

FIGS. 25 to 28 are schematic plan views of display devices according to another embodiment.

Referring to FIGS. 25 to 28, an optical path change layer C70 according to another embodiment may have different patterns. For example, patterns of the optical path change layer C70 disposed in pixel PX1, PX2 or PX3 may be different.

Referring to FIG. 25, the optical path change layer C70 may include a plurality of first pattern portions 70a having a bar shape in the first pixel PX1, one first pattern portion 70a corresponding to one emission region LA2 in the second pixel PX2, and the plurality of first pattern portions 70a having a bar shape in the third pixel PX3. That is, the optical path change layer C70 of the embodiment of FIG. 25 may have a structure in which the optical path change layer 70_2 of the embodiment of FIG. 17 and the optical path change layer 70 of the embodiment of FIG. 3 are commonly disposed.

Referring to FIG. 26, an optical path change layer C70_1 may include a plurality of first pattern portions 70a having an island shape in the first pixel PX1, one first pattern portion 70*a* corresponding to one emission region LA2 in the second pixel PX2, and a plurality of first pattern portions 70*a* having a bar shape in the third pixel PX3. That is, the optical path change layer C70_1 of the embodiment of FIG. 26 may have a structure in which the optical path change layer 70_4 of the embodiment of FIG. 20, the optical path change layer 70 of the embodiment of FIG. 3, and the optical path change layer 70_2 of the embodiment of FIG. 17 are commonly disposed.

Referring to FIG. 27, an optical path change layer C70_2 may include a plurality of first pattern portions 70*a* having an island shape in which the first pattern portions 70*a* of odd numbered rows and even numbered rows are disposed in different columns in the first pixel PX1, one first pattern portion 70*a* corresponding to one emission region LA1, LA2, or LA3 in the second pixel PX2, and a plurality of first pattern portions 70*a* having a bar shape in the third pixel PX3. That is, the optical path change layer C70_2 of the embodiment of FIG. 27 may have a structure in which the optical path change layer 70_5 of the embodiment of FIG. 21, the optical path change layer 70 of the embodiment of FIG. 3, and the optical path change layer 70_2 of the embodiment of FIG. 17 are commonly disposed.

Referring to FIG. 28, an optical path change layer C70_3 may include a plurality of first pattern portions 70*a* having a rectangular shape in the first pixel PX1, a first pattern portion 70*a* in which a first sub-pattern SB1 having a rectangular shape is disposed at a center portion of the emission region LA1, LA2, or LA3, and a second sub-pattern SB2 having a bar shape is disposed at an outer portion of the emission region LA1, LA2, and LA3 in the second pixel PX2, and a first pattern portion 70*a* in which the first sub-pattern SB1 having a rectangular shape is disposed at the outer portion of the emission region LA1, LA2, or LA3, and the second sub-pattern SB2 having a bar shape is disposed at the center portion of the emission region LA1, LA2, or LA3 in the third pixel PX3. That is, the optical path change layer C70_3 of the embodiment of FIG. 28 may have a structure in which the optical path change layer 70_6 of the embodiment of FIG. 22, the optical path change layer 70_8 of the embodiment of FIG. 24, and the optical path change layer 70_7 of the embodiment of FIG. 23 are commonly disposed. Thus, when the optical path change layer C70 having different configurations are formed according to different pixels, there is an advantage capable of controlling light output and external light reflectance in accordance with the pixels PX1, PX2, and PX3.

The structures of the optical path change layers shown in FIGS. 25 to 28 are an example, and the present inventive concept is not limited thereto. In addition, various shapes of the optical path change layers of FIG. 13 and FIGS. 18 to 28 may be applied to the embodiments of FIGS. 15 and 16.

Although the embodiments of the present inventive concept have been described with reference to the accompanying drawings, it should be clear to those of ordinary skill in the art to which the present inventive concept pertains that the present inventive concept can be implemented in other specific forms without changing the technical spirit or essential features of the present inventive concept. Therefore, it should be understood that the embodiments described above are illustrative and non-limiting in all respects.

The invention claimed is:
1. A display device comprising:
a first substrate including a plurality of pixels;
a second substrate facing the first substrate; and
an optical path change layer disposed between the first substrate and the second substrate, the optical path change layer including a first pattern portion and a second pattern portion,
wherein the first pattern portion has a first refractive index and includes a blue colorant, and the second pattern portion has a second refractive index smaller than the first refractive index, and
wherein the first pattern portion is disposed on each of the plurality of pixels and the second pattern portion is disposed at each boundary of the plurality of pixels and is in contact with the first pattern portion.
2. The display device of claim 1, wherein the first pattern portion absorbs green wavelength light and red wavelength light, and transmits blue wavelength light.
3. The display device of claim 2, wherein the first pattern portion includes a first surface in contact with the first substrate and a second surface in contact with the second substrate, and
wherein an area of the second surface is larger than an area of the first surface.
4. The display device of claim 2, wherein the first pattern portion includes at least one of acryl-based resin, a cardo-based resin, and fluorine-containing polyurethane acrylate (F-PUA).
5. The display device of claim 2, wherein the second pattern portion is an air gap.
6. The display device of claim 5, wherein the first refractive index of the first pattern portion is 1.4 or more.
7. The display device of claim 6, wherein the optical path change layer has a thickness less than or equal to 5 um.
8. The display device of claim 2, wherein the first substrate further includes an organic light-emitting element disposed in each of the plurality of pixels and the organic light-emitting element outputs blue light.
9. The display device of claim 8, wherein the first substrate further includes an encapsulation layer covering the organic light-emitting element,
wherein the second substrate includes a wavelength conversion pattern and a light transmission pattern, and a capping layer covering the wavelength conversion pattern and the light transmission pattern, and
wherein the optical path change layer is disposed between the capping layer and the encapsulation layer.
10. A display device comprising:
a first base part including a plurality of pixel regions in which a plurality of pixels are disposed;
an organic light-emitting element disposed on the first base part and disposed in each of the plurality of pixels;
an encapsulation layer disposed on the organic light-emitting element;
a second base part facing the first base part, the second base part including:
a wavelength conversion pattern and a light transmission pattern disposed between the second base part and the encapsulation layer, and
a capping layer covering the wavelength conversion pattern and the light transmission pattern; and
an optical path change layer contacting each of the encapsulation layer and the capping layer,
wherein the optical path change layer includes a first pattern portion having a first refractive index and a second pattern portion having a second refractive index smaller than the first refractive index, and the first pattern portion includes a blue colorant.

11. The display device of claim 10, wherein the first pattern portion absorbs green wavelength light and red wavelength light, and transmits blue wavelength light.

12. The display device of claim 11, wherein each of the plurality of pixels includes an emission region and a non-emission region, the first pattern portion is disposed to correspond to the emission region, and the second pattern portion is disposed to correspond to the non-emission region.

13. The display device of claim 12, wherein the first pattern portion includes a plurality of high refractive portions and a plurality of low refractive portions disposed between the plurality of high refractive portions.

14. The display device of claim 11, further comprising a first light-blocking layer disposed between the second base part and the wavelength conversion pattern and the light transmission pattern, and disposed to correspond to a boundary of each of the plurality of pixels,
   wherein the first light-blocking layer includes a first light-blocking portion disposed on the second base part and a second light-blocking portion disposed on the first light-blocking portion, wherein the first light-blocking portion includes a blue colorant.

15. The display device of claim 11, further comprising
   a second light-blocking layer disposed between the wavelength conversion pattern and the light transmission pattern,
   wherein the second light-blocking layer overlaps the first light-blocking layer in a thickness direction.

16. The display device of claim 15, further comprising
   a third light-blocking layer disposed on the encapsulation layer,
   wherein the third light-blocking layer overlaps the second light-blocking layer in the thickness direction.

17. A display device comprising:
   a first substrate including a plurality of pixels;
   a second substrate facing the first substrate; and
   an optical path change layer disposed between the first substrate and the second substrate, the optical path change layer including a first pattern portion and a second pattern portion,
   wherein the first pattern portion has a first refractive index and includes a blue colorant, and the second pattern portion has a second refractive index smaller than the first refractive index,
   wherein the first pattern portion includes a first surface in contact with the first substrate and a second surface in contact with the second substrate, and
   wherein an area of the second surface is larger than an area of the first surface.

18. A display device comprising:
   a first substrate including a plurality of pixels;
   a second substrate facing the first substrate; and
   an optical path change layer disposed between the first substrate and the second substrate, the optical path change layer including a first pattern portion and a second pattern portion,
   wherein the first pattern portion has a first refractive index and includes a blue colorant, and the second pattern portion has a second refractive index smaller than the first refractive index, and
   wherein the second pattern portion is an air gap.

* * * * *